United States Patent
Kucherov et al.

(10) Patent No.: US 6,946,596 B2
(45) Date of Patent: Sep. 20, 2005

(54) TUNNELING-EFFECT ENERGY CONVERTERS

(76) Inventors: Yan R. Kucherov, 5646 S. Park Place East, Salt Lake City, UT (US) 84121; Peter L. Hagelstein, 1500 Worcester Rd., Apt #717, Framington, MA (US) 01702

(*) Notice: Subject to any disclaimer, the term of this patent is extended or adjusted under 35 U.S.C. 154(b) by 32 days.

(21) Appl. No.: 10/243,455

(22) Filed: Sep. 13, 2002

(65) Prior Publication Data

US 2004/0050415 A1 Mar. 18, 2004

(51) Int. Cl.[7] .............................................. H02N 10/00
(52) U.S. Cl. ...................... 136/205; 136/239; 136/200; 136/236.1; 136/238; 310/304; 310/306; 257/467
(58) Field of Search ................................ 136/205, 239, 136/200, 236.1, 238; 310/304, 306; 257/467

(56) References Cited

U.S. PATENT DOCUMENTS

| | | | |
|---|---|---|---|
| 3,169,200 A | 2/1965 | Huffman | 310/306 |
| 3,173,032 A | 3/1965 | Maynard | |
| 3,267,308 A | 8/1966 | Hernqvist | |
| 3,328,611 A | 6/1967 | Davis | |
| 3,515,908 A | 6/1970 | Caldwell | |
| 3,579,031 A | 5/1971 | Kearns | |
| 3,808,477 A | 4/1974 | Swank | |
| 3,843,896 A | 10/1974 | Rason et al. | |
| 3,890,161 A | 6/1975 | Brown, III | |
| 3,899,696 A | 8/1975 | Fletcher et al. | |
| 3,983,423 A | 9/1976 | Rasor et al. | |
| 4,040,903 A | 8/1977 | Monroe, Jr. | |
| 4,047,093 A | 9/1977 | Levoy | |
| 4,151,438 A | 4/1979 | Fitzpatrick et al. | |
| 4,188,571 A | 2/1980 | Brunson | |
| 4,266,179 A | 5/1981 | Hamm, Jr. | |

(Continued)

FOREIGN PATENT DOCUMENTS

| | | |
|---|---|---|
| EP | 0 452 661 A3 | 10/1991 |
| JP | 2001-217469 A | 2/2001 |
| WO | WO 99/10974 A1 | 3/1999 |
| WO | WO 99/13562 A1 | 3/1999 |

OTHER PUBLICATIONS

U.S. Appl. No. 60/400,959, filed Aug. 1, 2002.
D.M. Rowe, Ph.D., D.Sc., *CRC Handbook of Thermolectrics*, CRC Press, 1995.

(Continued)

*Primary Examiner*—Alan Diamond
(74) *Attorney, Agent, or Firm*—Workman Nydegger

(57) ABSTRACT

Tunneling-effect converters of thermal energy to electricity with an emitter and a collector separated from each other by a distance that is comparable to atomic dimensions and where tunneling effect plays an important role in the charge movement from the emitter to the collector across the gap separating such emitter and collector. At least one of the emitter and collector structures includes a flexible structure. Tunneling-effect converters include devices that convert thermal energy to electrical energy and devices that provide refrigeration when electric power is supplied to such devices.

59 Claims, 13 Drawing Sheets

U.S. PATENT DOCUMENTS

| | | |
|---|---|---|
| 4,280,074 A | 7/1981 | Bell |
| 4,281,280 A | 7/1981 | Richards |
| 4,298,768 A | 11/1981 | Israel et al. |
| 4,303,845 A | 12/1981 | Davis |
| 4,323,808 A | 4/1982 | Davis |
| 4,346,330 A | 8/1982 | Lee et al. |
| 4,368,416 A | 1/1983 | James |
| 4,373,142 A | 2/1983 | Morris |
| 4,528,417 A | 7/1985 | Chubb |
| 4,667,126 A | 5/1987 | Fitzpatrick |
| 4,700,099 A | 10/1987 | Iden |
| 4,750,023 A | 6/1988 | Shannon |
| 4,755,350 A | 7/1988 | Kennel |
| 4,771,201 A | 9/1988 | Free |
| 4,927,599 A | 5/1990 | Allen |
| 5,028,835 A | 7/1991 | Fitzpatrick |
| 5,327,038 A | 7/1994 | Culp |
| 5,459,367 A | 10/1995 | Davis |
| 5,492,570 A | 2/1996 | Horner-Richardson et al. |
| 5,541,464 A | 7/1996 | Johnson et al. |
| 5,572,042 A | 11/1996 | Thomas et al. |
| 5,578,886 A | 11/1996 | Holmlid et al. |
| 5,600,200 A * | 2/1997 | Kumar et al. ........... 313/346 R |
| 5,623,119 A | 4/1997 | Yater et al. |
| 5,637,946 A | 6/1997 | Bushman |
| 5,646,474 A | 7/1997 | Pryor |
| 5,722,242 A | 3/1998 | Edelson |
| 5,780,954 A | 7/1998 | Davis |
| 5,841,219 A | 11/1998 | Sadwick et al. |
| 5,955,772 A | 9/1999 | Shakouri et al. |
| 5,973,259 A | 10/1999 | Edelson |
| 5,981,071 A | 11/1999 | Cox |
| 5,994,638 A | 11/1999 | Edelson |
| 6,020,671 A | 2/2000 | Pento et al. |
| 6,022,637 A | 2/2000 | Wilson |
| 6,037,697 A | 3/2000 | Begg et al. |
| 6,060,331 A | 5/2000 | Shakouri et al. |
| 6,203,939 B1 | 3/2001 | Wilson |
| 6,323,414 B1 | 11/2001 | Shakouri et al. |
| 6,396,191 B1 | 5/2002 | Hagelstein et al. ......... 310/306 |
| 6,403,874 B1 | 6/2002 | Shakouri et al. |
| 6,489,704 B1 | 12/2002 | Kucherov et al. .......... 310/306 |
| 6,534,784 B2 * | 3/2003 | Eliasson et al. .............. 257/25 |
| 6,720,704 B1 * | 4/2004 | Tavkhelidze et al. ....... 310/306 |
| 6,779,347 B2 | 8/2004 | Kucherov et al. |
| 2002/0033188 A1 | 3/2002 | Shakouri et al. |
| 2003/0042819 A1 | 3/2003 | Martinovsky et al. ...... 310/306 |
| 2003/0184188 A1 * | 10/2003 | Kucherov et al. .......... 310/306 |
| 2004/0029341 A1 | 2/2004 | Cox et al. ................... 438/237 |
| 2004/0189141 A1 * | 9/2004 | Tavkhelidze et al. ....... 310/306 |
| 2004/0207037 A1 * | 10/2004 | Kucherov et al. .......... 257/467 |

OTHER PUBLICATIONS

Bass, John C. et al., *Improved Thermoelectric Converter Units and Power Generators*, Electronics Tech Briefs, Dec. 1999.

DiSalvo, Francis, J., *Thermoelectric Cooling and Power Generation*, Science, vol. 285 (Jul. 30, 1999), pp. 703–70.

Mahan, G.D. et al., *Multilayer Thermionic Refrigerator and Generator*, Journal of Applied Physics, vol. 83, No. 9, May 1, 1998, pp. 4683–4689.

Mahan, G.D. et al., *Multilayer Thermionic Refrigeration*, Physical Review Letters, vol. 80, No. 18, May 4, 1998, pp. 4016–4019.

Rasor, Ned S., *VA. Technology of Thermoelectric and Thermionic Energy Conversion*, RASOR Associates Report, 1989, pp. 397–413.

Rasor, Ned S., *VB. Engineering Aspects of Thermionic Energy Conversion*, RASOR Associates Report, 1989, pp. 415–439.

Lin, T.P. et al., *Thermionic Emission Including Both Space-charge and Image Forces*, Journal of Applied Physics, vol. 85, No. 8, Apr. 15, 1989, pp. 3205–3211.

Capper, Peter, *Properties of Narrow Gap Cadmium–based Compounds*, EMIS Datareviews Series No. 10, Dec. 1993, pp. 207–211.

Bates, Clayton W. Jr., *Low–temperature Thermionic Emitters Using Metal–semiconductor Composites*, Materials Letters, vol. 23, Apr. 1995, pp. 1–5.

Shakouri, Ali et al., *Heterostructure Integrated Thermionic Coolers*, Applied Physics Letters, vol. 71, No. 9, Sep. 1, 1997, pp. 1234–1236.

Collier, C.P. et al., *Electronically Configurable Molecular–Based Logic Gates*, Science, vol. 285, Jul. 16, 1999, pp. 391–394.

Hagelstein, P.L et al., *Enhanced Figure of Merit in Thermal to Electrical Energy Conversion Using Diode Structures*, Applied Physics Letters, vol. 81, No. 3, Jul. 15, 2002, pp. 559–561.

Kucherov, Y. et al. *Energy Conversion Using Diode–like Structures*, Proceedings of the 21st International Conference on Thermoelectronics, 2002.

Hagelstein, P.L. et al. *Thermally–Induced Current Injection Across an n\*–n Junctions*, Proceedings of the 21st International Conference on Thermoelectronics, 2002.

Venkatasubramanian, R. et al. *Thin–Film Thermoelectric Devices with High Room–Temperature Figures of Merit*, Nature, vol. 413, Oct. 11, 2001.

\* cited by examiner

TUNNELING-EFFECT ENERGY CONVERTERS

THE FIELD OF THE INVENTION

The present invention relates generally to converters of thermal energy to electric energy. More specifically, the present invention relates to devices that, when exposed to a thermal gradient, generate electric energy under design and operating conditions such that tunneling between the converter plates is significant. The present invention also relates to devices that are thermodynamically reversible and can be used for cooling.

BACKGROUND OF THE INVENTION

Thermal energy can be directly converted into electric energy. Thermal energy converters are devices that directly convert thermal energy into electric energy. One type of such devices is a thermionic energy converter, in which heat is converted directly into electrical energy by thermionic emission. In this process, electrons are thermionically emitted from the surface of a metal by heating the metal and imparting sufficient energy to a portion of the electrons to overcome retarding forces at the surface of the metal in order to escape. Unlike most other conventional methods of generating electrical energy, thermionic conversion does not require either an intermediate form of energy or a working fluid, other than electrical charges, in order to change heat into electricity.

In its most elementary form, a conventional thermionic energy converter in an operational set-up consists of one electrode connected to a heat source, a second electrode connected to a heat sink and separated from the first electrode by an intervening space, leads connecting the electrodes to the electrical load, and an enclosure. The space in the enclosure is either highly evacuated or filled with a suitable rarefied vapor, such as cesium. Electrons are provided with enough thermal energy to be able to escape from one of the electrodes and travel to the other electrode. This is achieved in these devices by providing enough thermal energy to the electrons so that they have an energy that is at least the energy of the potential barrier to be overcome to travel from the emitting electrode to the collecting electrode.

The heat source supplies heat at a sufficiently high temperature to one electrode, the emitter, in a thermionic converter from which electrons are thermionically evaporated into the evacuated or rarefied-vapor-filled inter-electrode space. The electrons move through this space toward the other electrode, the collector, which is kept at a low temperature near the heat sink temperature. There the electrons condense and, upon closing the circuit, return to the hot electrode via external electrical leads and, for example, an electrical load connected between the emitter and the collector.

An embodiment of a conventional thermionic converter 100 is schematically illustrated in FIG. 1. These conventional devices typically comprise an emitter 110, or low electron-work-function cathode, a collector 112, or comparatively colder, high electron-work-function anode, an enclosure 114, suitable electrical conductors 116, and an external load 118. Emitter 110 is exposed to heat flow 120 which causes this cathode to emit electrons 122, thus closing the electric circuit and providing an electric intensity to load 118. As indicated above, inter-electrode space 130 in conventional thermionic converters is an evacuated medium or a rarefied-vapor-filled medium. The inter-electrode space in these converters is typically in the order of at least thousands of times greater than typical atomic dimensions. For example, the inter-electrode space in these converters can be in the order of about one tenth of a micrometer to one thousand or more micrometers, in which case the spacing between the electrodes is in the order of $10^3$ Å to $10^7$ Å.

The flow of electrons through the electrical load is sustained by the temperature difference between the electrodes. Thus, electrical work is delivered to the load.

Thermionic energy conversion is based on the concept that a low electron work function cathode in contact with a heat source will emit electrons. These electrons are absorbed by a cold, high work function anode, and they can flow back to the cathode through an external load where they perform useful work. Practical thermionic generators are limited by the work function of available metals or other materials that are used for the cathodes. Another important limitation is the space charge effect. The presence of electrons in the space between the cathode and anode will create an extra potential barrier which reduces the thermionic current. These limitations detrimentally affect the maximum current density, and thus present a major problem in developing large-scale thermionic converters.

Conventional thermionic converters are typically classified as vacuum converters or gas-filled converters. As indicated above, these converters have inter-electrode spacings that are at least several orders of magnitude greater than atomic dimensions. Vacuum converters have an evacuated medium between the electrodes. These converters have limited practical applications.

Attempts to reduce space-charge effects with vacuum converters have involved the reduction of the inter-electrode separation to the order of micrometers. Attempts to reduce the same effects with gas-filled converters have led to the introduction of positive ions into the cloud of electrons in front of the emitter. Nevertheless, these conventional devices still present shortcomings such as those related to limited maximum current densities and temperature regimes. A more satisfactory solution to converting thermal energy to electrical energy at lower temperature regimes with high efficiencies and high power densities has been sought with the use of solid state devices that still maintain an inter-electrode separation that is at least several orders of magnitude greater than atomic dimensions.

However, no converters have been provided that include inter-electrode separations in a range that is comparable with atomic dimensions. These converters are provided in the context of the present invention, with embodiments that have inter-electrode separations in the range of several tens of Ångstroms, a much reduced inter-electrode spacing. This reduction is typically in the range of several orders of magnitude with respect to inter-electrode separations in other converters that have inter-electrode separations in the range of not less than a few micrometers or a few tenths of a micrometer. The present invention provides such converters with inter-electrode separations that are comparable with atomic dimensions.

The reduction in inter-electrode spacing accomplished in the context of the present invention is not a mere change in the choice of design parameters or a matter of routine optimization of a length parameter. Miniaturization at the level provided by embodiments of the present invention requires the solution of design, manufacturing and modeling problems that are either not present in the context of conventional devices or that present themselves with different aspects and complexities. For example, microscopic electrode surface characteristics, such as surface irregularities, become relevant at such small inter-electrode separations, but such characteristics are slightly relevant, or even not relevant at all, in conventional devices with much larger inter-electrode separations. By way of another example, physical phenomena, such as tunneling, that are irrelevant in conventional devices, become very relevant when the inter-electrode separation is reduced to separations in the range of atomic length scales. Accordingly, special and complex characteristics of embodiments of the present invention such as those pointed out above by way of illustrative examples distinguish embodiments of the present invention from conventional devices that have much larger inter-electrode separations. As illustrated by the examples provided above, and described in the rest of the specification and drawings, these distinguishing features are not merely present in amount or extent, but in nature or kind of the devices themselves and of their design, manufacturing, and operational principles.

SUMMARY OF THE INVENTION

Tunneling-effect converters are developed in the context of this invention Conventional converters would have to operate at temperatures in excess of 1000 K to provide effective currents if they were subjected to operational conditions such as those used with embodiments of the present invention. The effects that become relevant in embodiments of the present invention permit the generation of effective electric currents at temperatures such and with potential energy barriers that would be prohibitive if used with conventional converters.

Design of embodiments according to the present invention include the use of at least one flexible electrode structure, so that the inter-electrode separation is such that tunneling becomes an effective component of the electric current. Such flexible electrode technology is implemented in combination with spacer formation in the context of this invention so that electric shorting due to electrode structure warping effects is prevented.

Electrode surfaces that face each other in embodiments of this invention are provided with atomically smooth surfaces at separations in the range of atomic dimensions. Electrode structures in embodiments of this invention comprise an emitter with an emitter surface and a collector with a collector surface. In these embodiments, such surfaces are facing each other, and they are separated by a distance such that the probability for electron tunneling between the emitter and the collector is at least 0.1%. Inter-electrode separations in some embodiments of the present invention are less than about 5 nm.

BRIEF DESCRIPTION OF THE DRAWINGS

A more particular description of the invention briefly described above will be rendered by reference to specific embodiments thereof which are illustrated in the appended drawings. Understanding that these drawings depict only embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

The present invention is directed to tunneling-effect converters. These converters provide electric energy from thermal energy by energy conversion according to a mechanism such that tunneling is a relevant factor in the charge carrier transport. In addition, converters according to the present invention are thermodynamically reversible and can be used for cooling. The term "converter" and related terms refer herein to devices that convert thermal energy to electric energy and also to devices that can operate in the reversible mode in which the device performs cooling when electric power is supplied to it. Converters according to the present invention are designed and manufactured to account for and to use tunneling effects. Furthermore, converters according to this invention incorporate design and manufacturing strategies to effectively build converters with inter-electrode separations in a range that is comparable to atomic length scales.

Figure 1:
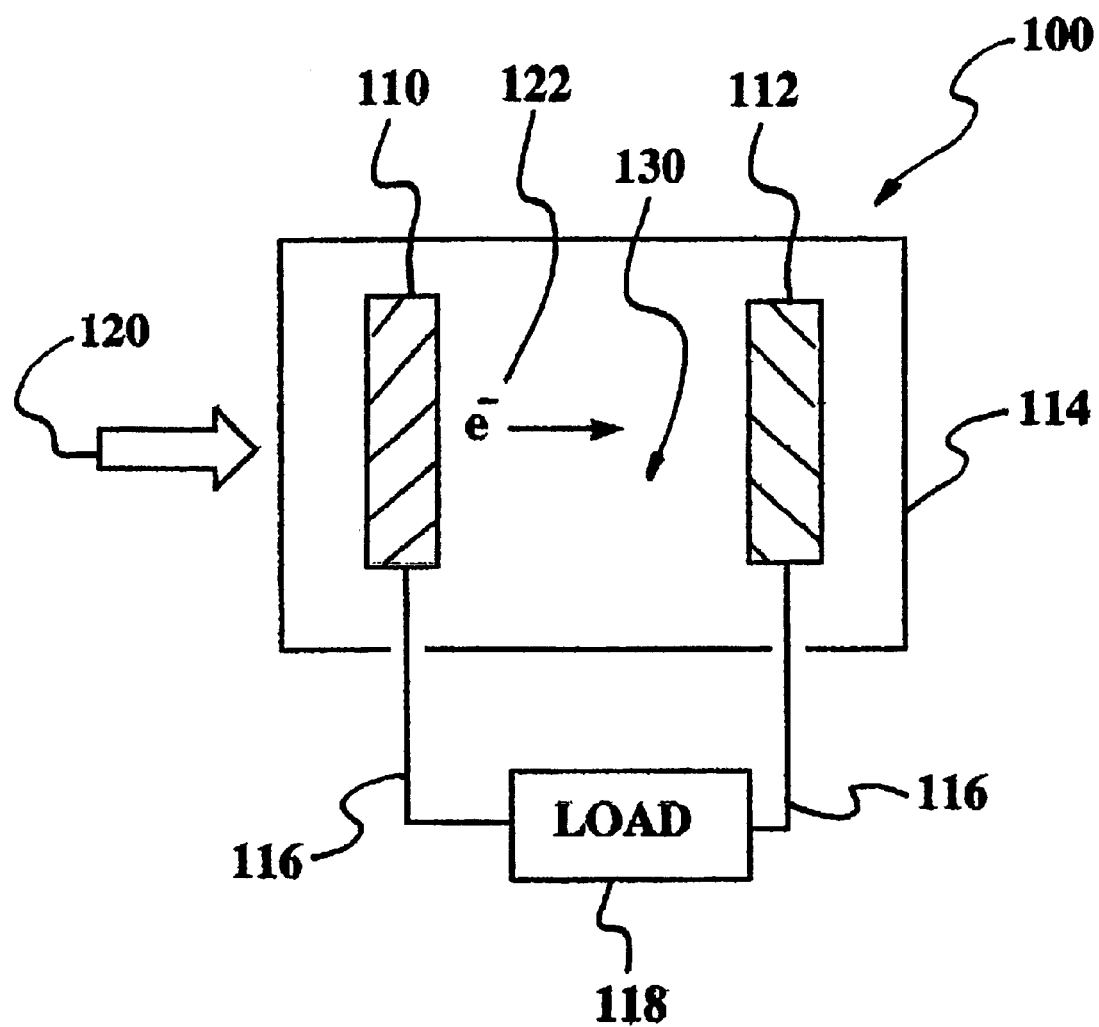
FIG. 1 schematically shows a conventional thermionic converter.
Figure 2:
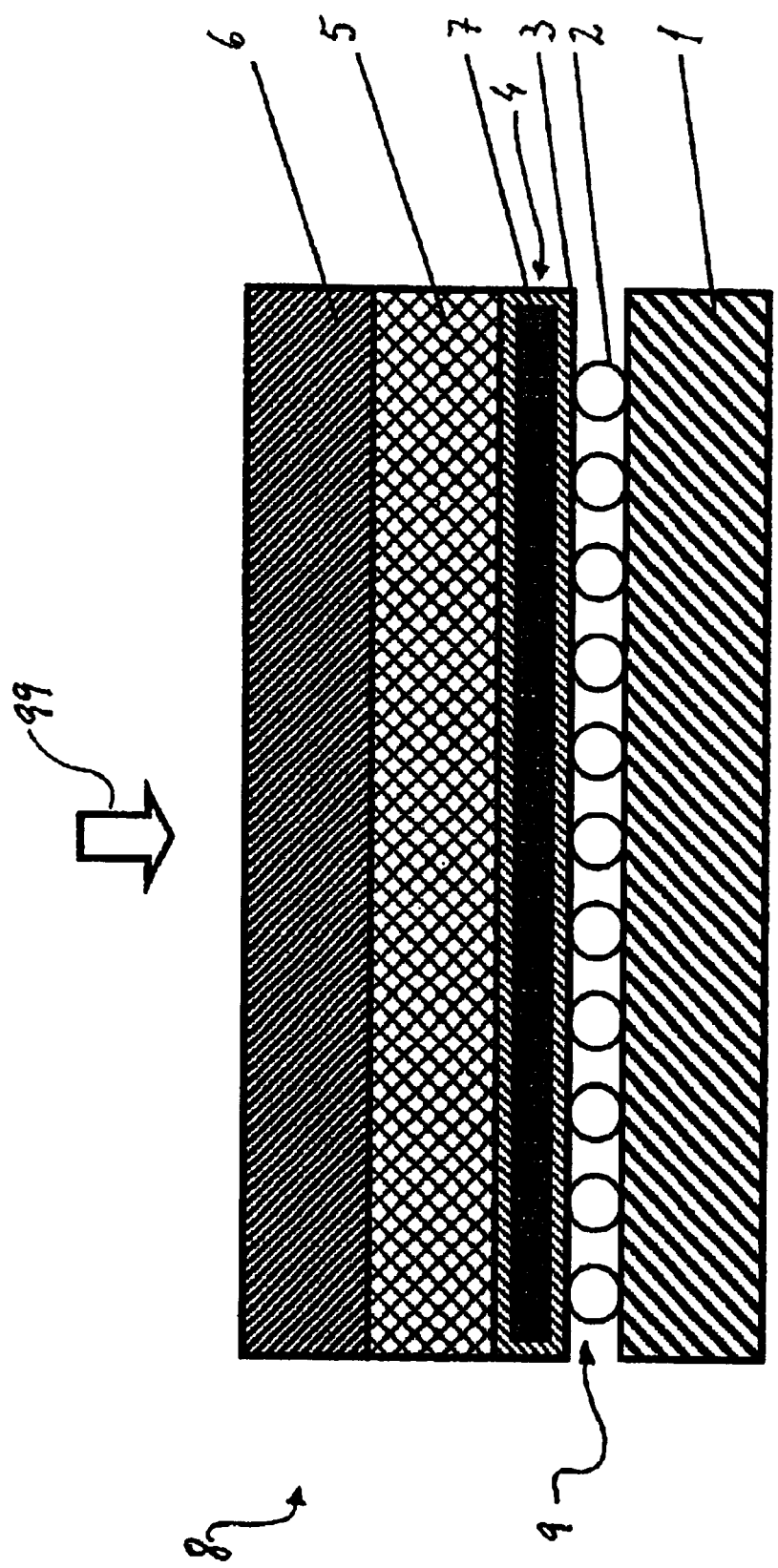
FIG. 2 schematically shows an embodiment of a tunneling-effect converter according to the present invention.

Embodiments of converters according to the present invention are schematically illustrated in FIG. 2. Converter 8 shown in FIG. 2 comprises two electrodes, collector 1 and emitter 4. The emitter temperature is noted as $T_1$ and the collector temperature is noted as $T_0$. To generate an electric current in the thermal to electrical energy conversion mode, these temperatures satisfy the relationship $T_1 > T_0$, namely, the emitter is hotter than the collector.

Collector 1 in some embodiments comprises an aluminum layer. One source of such material is aluminum substrate for optical discs, such as aluminum substrate provided by IBM. Aluminum layer used in the manufacturing of embodiments of converters according to this invention had about 3 Å RMS surface polishing (1 nm=10 Å).

Collector 1 in other embodiments of converters according to this invention comprises at least one semiconductor substrate, such as silicon. The semiconductor substrate is metallized and repolished.

Emitter 4 comprises an electrically conductive material. In some embodiments, as illustrated in FIG. 2, emitter 4 comprises a silicon layer 7 coated with an electrical conductor, such as molybdenum coating 3. Embodiments of emitter 4 were manufactured with silicon wafer whose thickness was about 10 μm (μm=micrometer, also known as micron) coated with molybdenum coating which had a thickness of about 1000 Å. Silicon wafer material was obtained from Virginia Semiconductors. Embodiments of emitter 4 were finished with about 10 Å RMS surface polishing. The surfaces of the emitter and the collector that face each other in embodiments of converters according to this invention are preferably finished with a surface polishing such that roughness that does not exceed about 20 Å RMS, and more preferably not exceeding 10 Å RMS.

At least the sides of the emitter and the collector that face each other in some embodiments of this invention have infra-red (IR) radiation emissivity and/or reflectivity surface characteristics such that the collector surface is reflective of IR radiation. Embodiments that include a collector that is manufactured with Al are provided with such collector reflectivity characteristics due to the IR reflectivity of an exposed Al surface. The preferable electrode surface characteristics are such that the IR emissivity of the emitter surface is greater than that of the collector surface.

High IR emissivity can be achieved with high IR emissivity surface materials, such as with at least one of metal carbide, Fe, Co, and Ni, and combinations thereof. The term "combinations" includes mixtures and/or alloys elsewhere in this specification where these forms are applicable. High IR reflectivity is achieved with high IR reflectivity surface materials, such as with at least one of Al, Cu, Ag, Au, and combinations thereof. A choice of a high IR emissivity surface emitter and/or high IR reflectivity surface collector in embodiments of this invention as described herein facilitates the reduction of radiative losses in embodiments of the present invention.

The sides of the emitter and the collector that face each other in converters according to this invention have surface irregularities whose extent is preferably controlled. This surface irregularity control addresses factors such as the sensitivity of tunneling to electrode separation and the small inter-electrode separation in converters according to this invention. The sides of the emitter and the collector that face each other are referred to, respectively, by the terms emitter surface and collector surface. Emitter and collector surfaces that have surface characteristics with surface irregularities such as those described herein are concisely referred to as being "atomically smooth".

Figure 3:
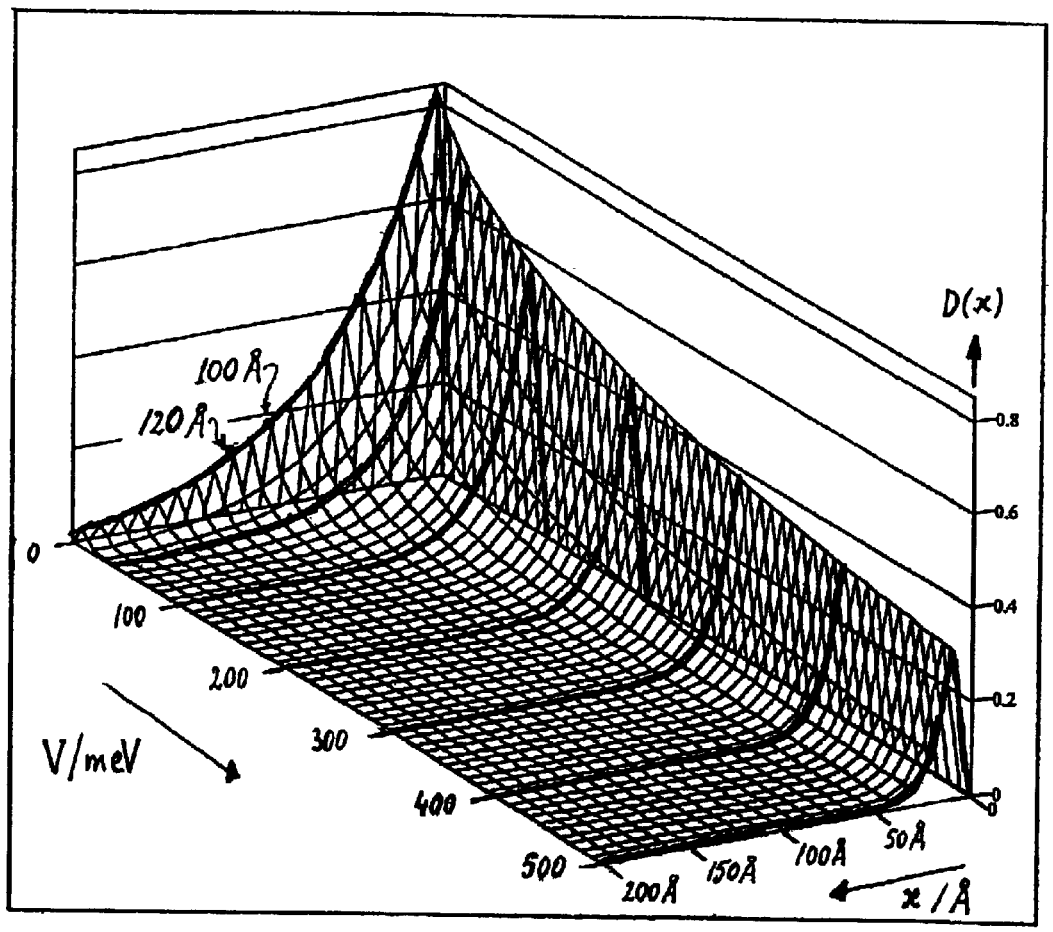
FIG. 3 displays a graph of electron tunneling probability as a function of electron potential energy and barrier width.

A large variation in the surface irregularities due to irregularities significantly larger than an atomic length scale would lead to a large variation of tunneling across the electrode surface. This high sensitivity of tunneling to emitter-collector surface separation is illustrated in FIG. 3. Areas with ineffective tunneling would lead to more inefficient converters where the conversion mechanisms according to the present invention play a significant role.

As shown in FIG. 3, tunneling is very sensitive to the distance that the tunneling particle has to travel from the surface of the emitter to the surface of the receptor. FIG. 3 displays a graph of electron tunneling probability, D(x), as a function of the electron potential energy V, and the barrier width, x, for $0\text{ Å} \leq x \leq 200\text{ Å}$ and $0\text{ eV} \leq V \leq 0.5\text{ eV}$ in the WKB solution of the one dimensional Schrödinger equation. As shown in FIG. 3, a tunneling probability close to 0.2 can be achieved at separations of about 100 Å when the potential energy is close to 0 eV, but no significant tunneling probability exists at separations of more than or equal to about 50 Å when the potential energy exceeds about 0.4 eV. Conventional converters typically operate at inter-electrode spacings, or barrier widths, in the range from about $10^6$ Å to about $10^7$ Å, and at barrier potential energies in the range from about 1.5 eV to about 2.0 eV (electron work function). As shown in FIG. 3, tunneling in this conventional regime is practically nil.

As it can be inferred form FIG. 3, such a significant transmission coefficient would not be achievable in the absence of image force barrier reduction. This effect becomes even more relevant in embodiments of the present invention that operate in the refrigeration regime, because the efficiency in such operational mode depends on the ratio of the available thermal energy to the barrier height, and thus a reduction in barrier height leads to an increase in the refrigeration efficiency.

Inter-electrode separations in the range of atomic length scales in embodiments of converters according to the present invention can be effectively achieved where the surface irregularities of the sides of the electrodes that face each other are less than or comparable at most to such inter-electrode separations. If the surface irregularities were significantly greater than the atomic length scales that characterize inter-electrode separations, then the concept of inter-electrode separation in such range would vanish. Embodiments of converters according to the present invention are manufactured so that the inter-electrode separations do not exceed about 50 Å. Some embodiments according to the present invention have an inter-electrode separation of not more than about 30 Å. This is the separation between the emitter surface and the collector surface. Some embodiments of converters according to this invention have inter-electrode separations of about 10 Å, and they comprise an emitter such that its work function is about 4.2 eV. Other embodiments have inter-electrode separations of about 25 Å, and they comprise an emitter such that its work function is about 1.5 eV. A lower emitter material work function permits the design of converters that have a greater range of inter-electrode separations at which tunneling is still significant.

As shown in FIG. 3, the transmission coefficient for tunneling through a metal-vacuum interface barrier (work function) in the order of a few electron-volts (eV) is small except at spacings of a few Ångstroms. For example, the thermal energy that is available to a significant number of electrons at about 200° C. is approximately $4k_BT$–$5k_BT$, which is approximately 0.16 eV–0.20 eV. This energy is significantly below a potential energy barrier created by a metal-vacuum interface with an electron work function in the range from about 3 eV to about 5 eV for most metals.

Converters according to this invention that comprise emitter materials with higher work functions are preferably coated, at least on the side that faces the collector. Such coating comprises at least one low work-function material. For example, most materials have a metal-vacuum interface barrier in the range from about 3 eV to about 5 eV. Materials such as Ir, Os, Pt, Au, Re, and some crystallographic orientations of metals such as W and Ni, have electron work functions that can exceed 5 eV. Oxides, such as those of Pt, Ag, Ta, V, and Nb, can have work functions in excess of 6 eV. To lower the work function of the emitter material, a low electron work function material, such as at least one of alkali and alkaline earth materials and combinations thereof, examples of which are Cs, Ba, Sr, Rb, Na, Ca, Li, and combinations thereof, is absorbed on a high work function material to reduce the emitter surface work function to, preferably, about 1.1 eV–1.2 eV. The presence of such lower work-function material layer is optional, and it is not shown in the embodiment schematically depicted in FIG. 2. In some embodiments, this material layer is found as a coating of the emitter side that faces the collector.

Some embodiments of this invention comprise a multi-coated emitter surface. For example, the emitter surface is in some embodiments coated with a first coating comprising a material with an electron work function of at least about 3.5 eV, which is coated with a second coating comprising a material with an electron work function that does not exceed about 3.5 eV. Examples of first coating materials include at least one of platinum oxide (wherein this term refers to substances such as PtO, other stoichiometric forms of platinum oxide, and combinations that comprise platinum and oxygen), silver oxide (wherein this term refers to substances such as AgO, other stoichiometric forms of silver oxide, and combinations that comprise silver and oxygen), tantalum oxide (wherein this term refers to substances such as $Ta_2O_5$, other stoichiometric forms of tantalum oxide, and combinations that comprise tantalum and oxygen such as at least one tantalate), vanadium oxide (wherein this term refers to substances such as $V_2O_5$, other stoichiometric forms of vanadium oxide, and combinations that comprise vanadium and oxygen such as at least one vanadate), Os, Ir, Pt, Re, Ni, W, and combinations thereof. Examples of second coating materials include at least one of alkali metals, alkaline earth metals and combinations thereof, such as Cs, Ba, Sr, Rb, Na, Ca, Li, and combinations thereof. Still other embodiments of this invention comprise a plurality of coatings, such as at least three coatings, with varying electron work function values. Embodiments with such plurality of coatings are subsumed herein in the explicitly described embodiments that are understood as comprising at least two coatings.

Barriers near 1.1 eV–1.2 eV are implemented in embodiments of converters according to the present invention, but these barriers are typically too high for non-tunneling thermionic converters (an energy barrier in the range 1.1 eV to 1.2 eV is still significantly greater than 0.16 eV). Such non-tunneling thermionic converters would have to operate at emitter temperatures higher than 1300 K to generate a significant current density. A converter operating at lower temperatures and under such conditions would have a very low efficiency. Refrigerator efficiency in this case is also low, because more than 1 eV must be invested to cool the emitter by few $k_B T$.

However, converters according to the present invention that operate in the tunneling effect regime provide effective current density from thermal energy conversion at practical lower temperatures, including temperatures close to room temperature, and with temperature gradients that include emitter/collector temperature differences of a few tens of degree centigrade.

It is believed that one of the factors that may contribute to the effective thermal to electrical energy conversion of tunneling effect devices according to the present invention is barrier reduction due to image forces, which leads to a smaller effective potential barrier. Embodiments according to the present invention, however, are not limited by any specific model or theory that supports their effective operation. Image force barrier reduction will be discussed hereinbelow after the following description of examples of embodiments according to the present invention.

Spacer 2 is located in the inter-electrode region 9. Spacer 2 is shown in FIG. 2 as comprising a plurality of particles that have spherical shape, but this shape is only shown for illustrative purposes and it is understood that the shape of spacer 2 material is not a limiting feature of embodiments of the present invention and that spacers have in other embodiments any one among a plurality of regular and/or irregular shapes, such as polyhedral, cylindrical, conical, frustoconical, pyramidal, frustopyramidal, prismatic, in regular and/or irregular manifestations, combinations thereof in their regular and/or irregular manifestations, and spacers that include curved surfaces, combinations of planar and curved surfaces, including embodiments with convex surfaces, concave surfaces, and combinations thereof Particles forming spacer 2 have a preferred average particle size of not more than about 50 Å, although a small number of layer particles may have, depending on the formation technique, a particle size of up to about 500 Å. The effect of these layer particles, however, is reduced by an appropriate treatment, such as by compressive forces between the electrodes, and they are discussed below.

The gaps between the spacers in the inter-electrode region comprise in some embodiments a rarefied medium, sometimes concisely referred to as a vacuum. Thermal conductivity of a gas-filled gap becomes negligible at pressures of or below about $10^{-4}$ Torr. Rarefied media in the context of this invention includes gas-filled gaps at such low pressures. It is understood that embodiments according to this invention are properly sealed by using techniques and materials within the ordinary skill in the art to preserve such rarefied media.

Spacer 2 in some embodiments of the present invention is formed by deposition. More particularly, spacer material was deposited by excimer laser ablation of a $TiO_2$ target on collector 1. The deposited particles had an average particle size in the range from about 25 Å to about 50 Å, with an inter-particle spacing in the range from about 200 Å to about 1000 Å. A small number, in the order of about 10 particles/$cm^2$, of such deposited particles had dimensions characterized by a length parameter of about 500 Å.

A compressive force symbolized in FIG. 2 by arrow 99 keeps the electrodes in converters according to this invention at a desired inter-electrode separation that is in the atomic length scale. This compressive force causes the distortion of at least one flexible electrode, so that the effect of large particle spacers is reduced. As a consequence of this reduction in the effect of the particle spacers that have large sizes, an inter-electrode separation is maintained at an average value at which tunneling significantly contributes to charge carrier transport across at least a substantial portion of the inter-electrode region 9 area.

Compressive force 99 is applied in some embodiments with external devices. Compressive force 99 is in other embodiments applied at the manufacturing stage when the various layers of the converter, such as converter 8, are sandwiched together, and they are subsequently kept together by a suitable holder, such as adhesive material, at least one clamp, sealant, encapsulating material, interlocking device, and combinations thereof.

Figure 2A:
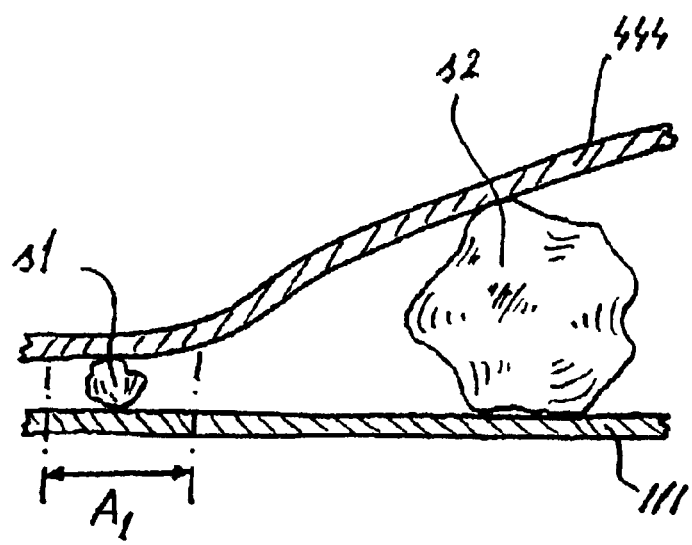
FIGS. 2A–2B schematically show distortion of at least one flexible electrode in embodiments of this invention that have irregularly sized spacers.
Figure 2B:
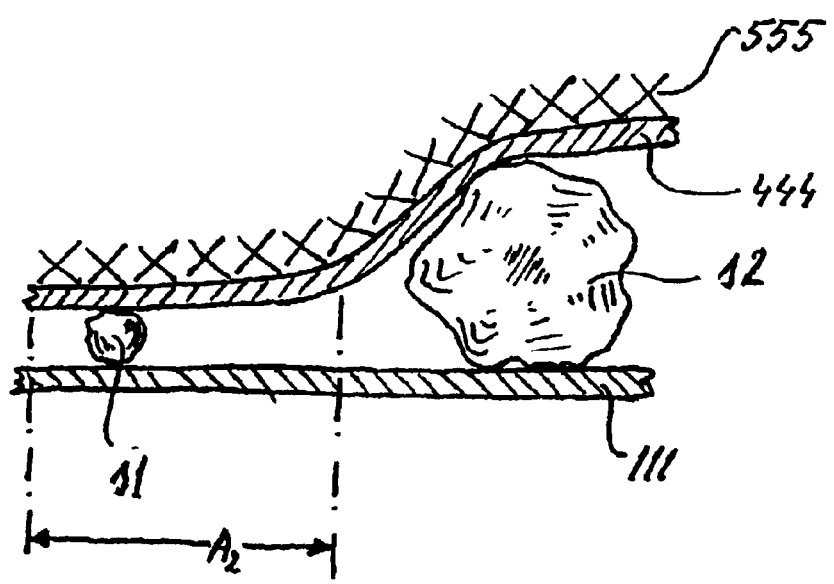
Figure 2C:
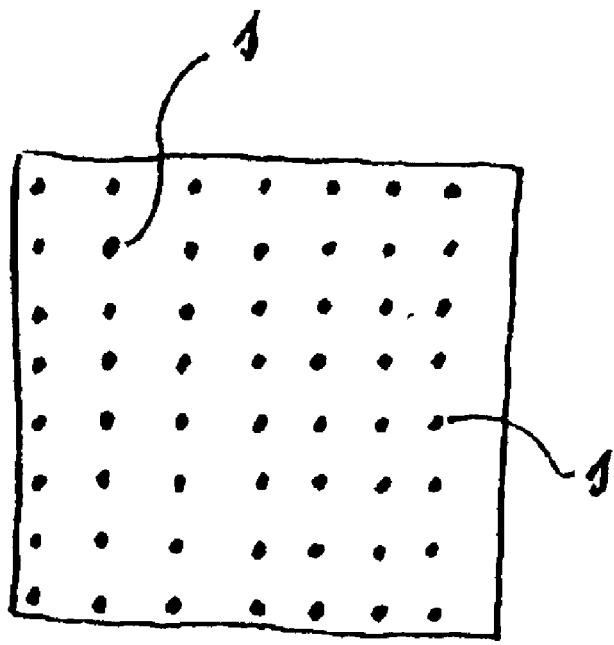
FIGS. 2C–2D schematically show examples of spacer distributions in embodiments of this invention.
Figure 2D:
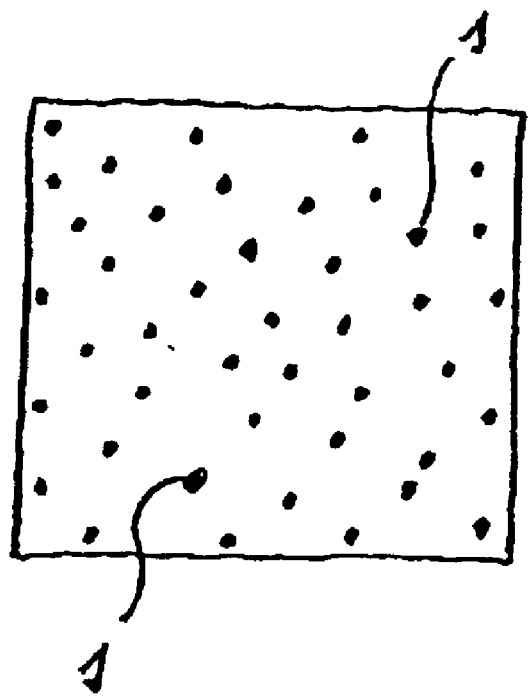

It is understood that any one of such holders can be embodied in any one of the ways of effectively configuring such holder. For example, the holding material is configured in some embodiments at least partially surrounding the electrode structures to prevent their recovery of a separated configuration at which tunneling would be ineffective. The holding material is configured in other embodiments at least partially within some of the inter-electrode planes to prevent the recovery by the electrode structures of a separated configuration at which tunneling would be ineffective. The holding material is configured in still other embodiments at least partially surrounding the electrode structures and at least partially in some of the inter-electrode planes. Examples of these holder configurations are schematically shown in FIGS. 2E–2G.

Figure 2E:
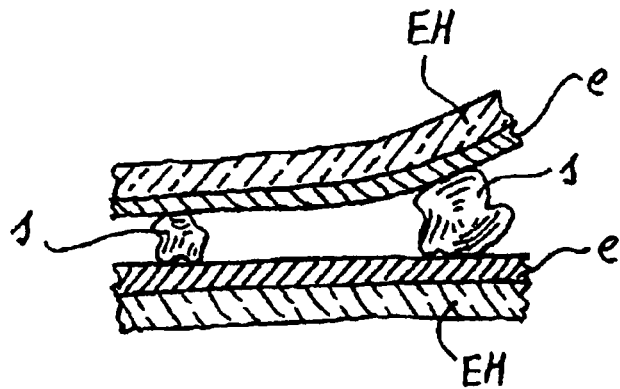
FIGS. 2E–2G schematically depict partial cross sections of embodiments according to this invention showing examples of holder configurations.

FIG. 2E schematically depicts a partial cross section of an embodiment according to the present invention showing electrode structures e, spacers s, and an external holder EH. Examples of such external holder are provided by at least one clamp and by an encapsulant.

Figure 2F:
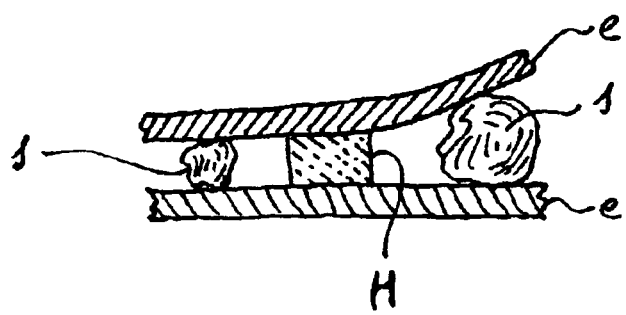
Figure 2G:
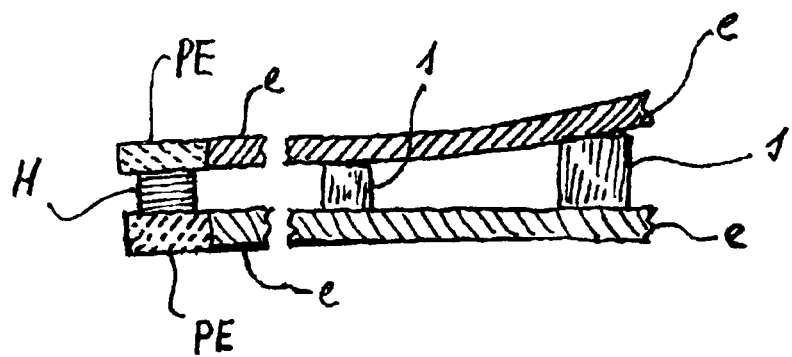

FIG. 2F schematically depicts a partial cross section of an embodiment according to the present invention showing electrode structures e, spacers s, and a holder H disposed within the inter-electrode planes and in contact with such electrode structures. FIG. 2G schematically depicts a partial cross section of an embodiment according to the present invention showing electrode structures e, spacers s, electrode plane extensions PE, and a holder H disposed within the inter-electrode planes, but not in contact with such electrode structures. Examples of such holder H are provided by a sealant, adhesive material, and an interlocking device.

These examples are illustrative and it is understood that embodiments of this invention comprise combinations thereof and combinations of the various holders that can be implemented with the ordinary skill in the art and the teachings provided herein.

Some embodiments of the present invention include at least one of the emitter and collector in the form of a flexible, electrically conductive layer. In preferred embodiments, the emitter comprises a thin flexible layer that is configured for receiving an applied pressure. This pressure can be applied, for example, through a mesh. The flexible layer thickness in some embodiments of this invention is less than or equal to about 20 $\mu$m.

The flexible layer comprises in some embodiments a dielectric material with an electrically conducting coating. Other embodiments have a flexible layer that comprises a semiconductor material, preferably with an electrically conducting coating. Still other embodiments have a flexible layer comprising a dielectric material with an electrically conducting coating and a semiconductor material, and other embodiments include combinations thereof. The electrically conducting coating comprises a metal in some embodiments, and an example of semiconducting material with an electrically conducting coating is provided by Ni-coated silicon.

Spacers in some embodiments of this invention are manufactured by lithographic techniques. Still other embodiments of the present invention comprise spacers that have been manufactured by lithography and spacers that have been formed by deposition.

Regardless of the manufacturing technique, spacers in some embodiments of this invention have irregular sizes. This characteristic is schematically illustrated in FIGS. 2A–2B, where two dissimilar spacers s1 and s2 are shown for illustrative purposes, but not as a limitation to any particular embodiment of this invention.

Collector 111 schematically represents any embodiment of a collector according to this invention and emitter 444 schematically represents any embodiment of an emitter according to this invention. Structure 555 schematically represents any embodiment of an element or combination of elements that facilitate force load distribution, such as a flexible layer, a holder, and combinations thereof As indicated above, examples of such elements or combinations thereof are a flexible mesh, a nanowire mesh, adhesive material, at least one clamp, sealant, encapsulating material, and combinations thereof.

Most of the area around large particle s2 shown in FIG. 2A is ineffective for tunneling, which would take place only in a small area, such as area $A_1$, in the immediate neighborhood of small particle s1. The use of structure 555 causes the at least one flexible electrode according to this invention to distort as schematically illustrated in FIG. 2B, and thus increase the area where tunneling takes place effectively to an area such as that illustrated by $A_2$.

Structure 555 in embodiments of this invention facilitates at least one of the following effects: distort at least one flexible electrode to increase the area at which the electrodes are separated by a distance at which tunneling is effective, and reduce the effects of the size of large particle spacers so that the distance between the electrodes is reduced and tunneling is thus effectively increased.

Emitter 444 is shown in FIGS. 2A–2B as being the flexible electrode in one embodiment of this invention. In other embodiments of this invention, the collector is a flexible electrode. Still in other embodiments, the collector and the emitter are flexible electrodes.

It is understood that the effect of structure 555 includes the distribution of a load, such as compressive force 99, that is applied to keep the emitter and collector close to each other. It follows from the examples of structure 555 provided herein that such structure is located with respect to the electrodes so that the force distribution is effectively facilitated, and the location schematically shown in FIG. 2B is simply one example of such location, but other locations are possible in other embodiments of this invention.

The design of embodiments according to the present invention provides an additional advantage in the prevention of detrimental warping effects. As the electrode temperature increases, electrode distortion or warping would lead to shorting and thus the converter would be rendered useless. To avoid shorting, the inter-spacer distance to the spacer height ratio is preferably on average at least about $10^3$.

Most spacer manufacturing techniques that incorporate this ratio as one of the manufacturing parameters will lead to the formation of a number of larger spacers that would detrimentally affect the tunneling efficiency of the converter as noted in the discussion of FIG. 2A. The flexibility of at least one of the electrodes in embodiments according to this invention and flexible electrode distortion as described herein, for example as shown in the discussion of FIG. 2B, permits the use of a wide range of such ratios, including large ratios above $10^3$.

Spacers s in embodiments of this invention are not limited to specific location distributions. For example, some embodiments have a regular spacer distribution such as that schematically shown in FIG. 2C, and some embodiments have an irregular spacer distribution, such as that schematically shown in FIG. 2D. Still other embodiments have a combination of regular and irregular spacer distributions in different electrode areas. It is also understood that regular spacer distributions are not limited to square patterns such as that illustrated in FIG. 2C, but that they also include other patterns, such as polygonal patterns, patterns with curved features, and combinations thereof.

Means for load distribution according to the present invention include structures and/or combinations of structures that perform or cooperate in performing at least one of the following functions (a)–(d): (a) distributing an external load, such as the external load associated with compressive force 99; (b) holding the electrodes at a separation that permits effective tunneling as described herein; (c) facilitating the distortion of at least one electrode as described herein; and (d) reducing spacer size as described herein. Examples of these structures include a force applicator to externally apply a compressive force, a holder, adhesive material, at least one clamp, an interlocking device, a sealant, an encapsulant, a mesh, a flexible layer, a nanowire mesh, an electrically conductive mesh, a flexible mesh, combinations thereof, equivalents of these structures, and equivalents of combinations of these structures.

Figure 4:
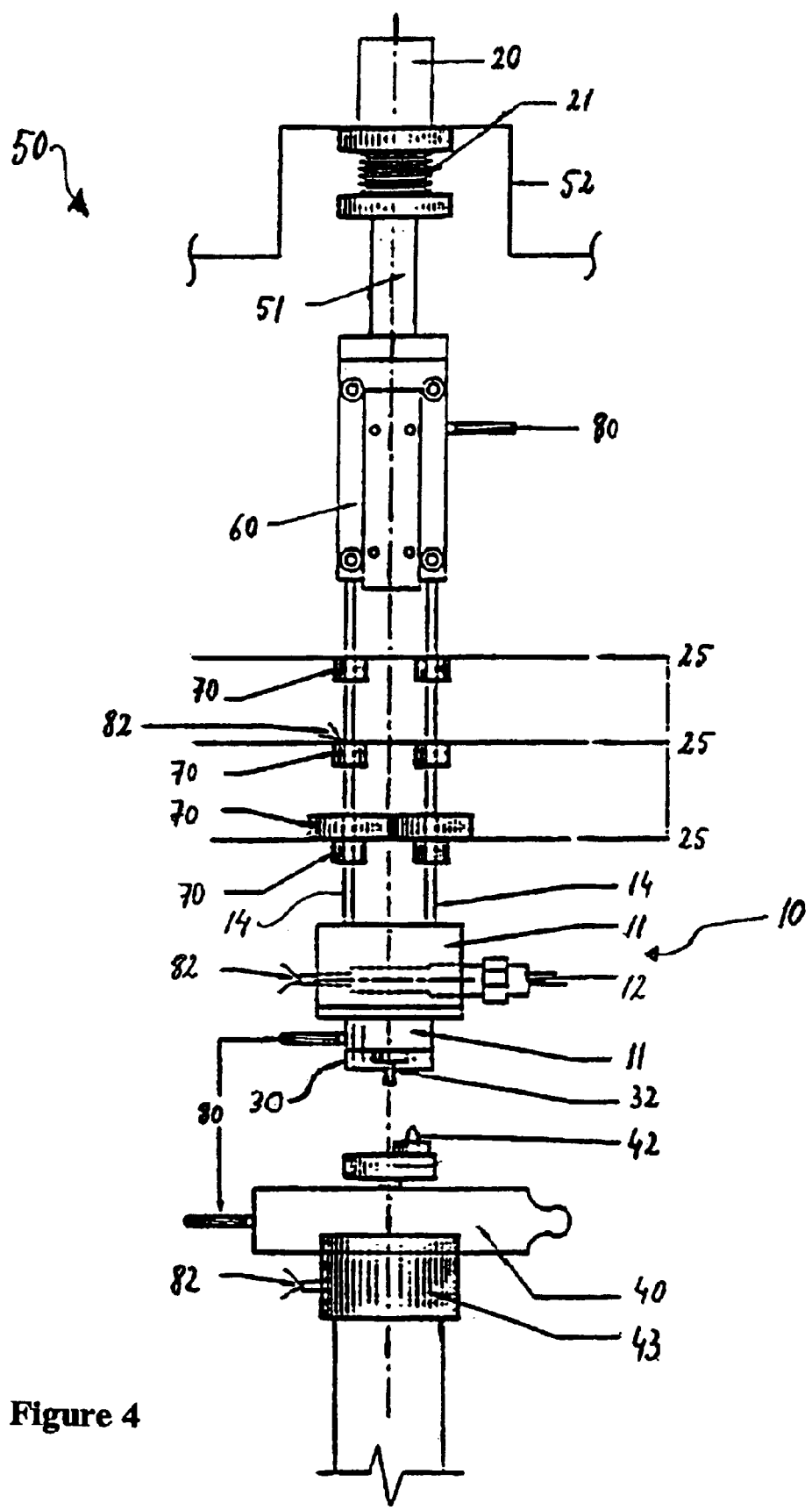
FIG. 4 schematically shows a testing device according to the present invention.

An externally applied compressive force is used, for example, with a testing device as schematically illustrated in FIG. 4. Other operational modes according to this invention use such compressible force application that is not limited to its use only with a testing device. As illustrated in FIG. 4, a nanopositioner can exert such force.

An electrically conductive mesh, such as nanowire mesh 5, as shown for illustrative purposes in FIG. 2, is optionally placed in some embodiments of converters according to this invention on and in electric communication with emitter 4. If any other layer or material is placed between the electrically conductive mesh and the emitter, such layer or material should allow for electric communication between the mesh and the emitter. Mesh material in embodiments of this invention comprises at least one of carbon, metal, metal-coated dielectric, semiconductor, and combinations thereof. Where applicable in this specification, the term "combinations" includes embodiments where one of the constituents coats another constituent. In case of the mesh material, for example, the foregoing description includes metal-coated semiconductor.

Nanowire mesh 5 is embodied in some converters according to this invention by a carbon nanowire mesh layer that is about 0.5 mm thick. Nanowire diameter, including carbon nanowire diameter, is preferably in the range from about 1 nm to about 50 nm, and more preferably about 200 Å, but other diameters are also envisaged in other nanowire embodiments for converters according to this invention. The presence of this mesh in some embodiments of this invention facilitates a force load distribution across the surface that is subjected to the effects of the flexible mesh material. Although nanowire mesh is a preferred material, any one among a variety of materials and combinations thereof can be used instead of or in combination with nanowire mesh to form a layer equivalent to layer 5, provided that such layer has a flexibility that allows for its mechanical performance in a manner that is comparable to that of nanowire mesh and thus facilitates force load distribution.

Some embodiments of the present invention include at least one of the emitter and collector that comprises a thin flexible layer of electrically conductive material. These embodiments can, in addition, have also a flexible mesh as described herein.

Nanowire mesh 5 is provided with a suitable electrical connector for connection with an external electric circuit. This connector comprises in some embodiments a denser mesh. In other embodiments, this connector comprises a metal contact, preferably polished, such as metal contact 6 shown in FIG. 2. Collector 1 itself is in some embodiments an electrical connector for connection with an external circuit. In other embodiments, a connector is attached to collector 1.

It is understood that the converter depicted in FIG. 2 is schematic, and that the various features shown therein can be varied in the numerous embodiments of converters according to this invention. Furthermore, layer thickness for each layer depicted in FIG. 2 is not shown at scale, but only schematically. For example, FIG. 2 shows a cross section of a converter in which most of the layers have the same contact surface. It is understood that this characteristic is not limiting, and that embodiments of converters according to the present invention can have at least one layer that extends over a surface that is different from the surface over which some other layer extends. Furthermore, a cross-section analogous to that shown in FIG. 2 for some converters according to this invention would show a plurality of layers with a plurality of different widths.

FIG. 4 schematically shows a vacuum test apparatus for testing the conversion characteristics of converters according to this invention. The use of such apparatus is discussed for a free standing case with no spacers, and also for a converter with spacers as schematically shown in FIG. 2.

A vacuum test apparatus 50 for small gap tunneling experiments was built for these experiments. An embodiment of such apparatus is schematically depicted in FIG. 4. The vacuum test apparatus was built on the basis of MDC Vacuum Products Corporation SSAC-12 ultrahigh vacuum chamber for surface analyses. The chamber was installed on a vibration insulating air table with a flexible stainless steel vacuum hose. Pfeiffer vacuum TMU-56 turbomolecular pump with a dry roughing pump provided standard vacuum in the $10^{-6}$ Torr range without significant heating of the chamber. At this vacuum, heat losses due to air thermal conductivity are much less than radiation losses.

The apparatus comprises a material manipulation device, such as micrometer 20 with micrometer feed 21, that permits the precise manipulation of material within wall 52 of a high vacuum chamber. A micrometer extension 51 reaches into linear nanopositioner 60. Electrical connections 80 via feedthroughs are provided as is conventional in the technology of high vacuum chambers.

The chamber had a cooling system embodied by a copper water cooled finger 43 with a diameter of about 40 mm. The cold finger provided also a sample mounting platform for the collector material.

The hot emitter 10 side was formed by a massive Invar-36 block and cap 11 with Ogden Scientific vacuum-rated 80 W cartridge heater 12. The block was attached by four Invar rods 14 (only two of such rods are shown in FIG. 3) to micrometer 20 on the upper flange, which allowed for Z-axis positioning. Micrometer 20 was installed through the tilting flange, allowing alignment of contacting surfaces.

Three radiation and/or thermal screens 25 were fixed to the Invar rods to prevent micrometer overheating. Although other materials could be used, Invar alloy used as a construction material is preferred because it reduces thermal expansion effects. Mounting of screens 25 included the use of a plurality of collars 70.

The power to the heater was provided by a Kepco ATE 75-1.5 stable power supply to reduce temperature drift. Omega K-type thermocouples 82 were used as temperature sensors with a Keithley 2001 multimeter as a display.

Thermal equilibration of the chamber to a level of about 1 degree per hour took at least 6 hours. A vacuum of the order of $10^{-6}$ Torr could be achieved in this set-up in approximately 2 hours.

The chamber was modified in the context of this invention to install the linear nanopositioner, which was embodied by a 1 Å resolution Physik Instrumente LISA® (PZT) linear nanopositioner that included a capacitative sensor with analog output. This combination allowed for position readouts to better than 1 Å relative positions as measured with a Keithley 2001 multimeter.

In one set of tests, a polished rod was attached to the Invar heating block, forming an emitter. Rod 30 was embodied in some tests by a Mo rod that was about 3 mm in diameter with end 32 polished to about 20 Å RMS. The rod material in other experiments comprised polished Invar, and in still other tests it comprised Invar coated with Pt.

On the collector side, an Invar tip holder was installed on a sliding copper table 40 that could be manually moved with the aid of a side manipulator arm (not shown). This design allowed for Y-axis movement of the tip along the emitter. Malleable sharpened metal tips 42, such as Au or In, were used as a tip material in order not to damage the nanopositioner mechanically (10 lb maximum load). This design was intended to increase contact area. Spring loaded Invar rods were used in other embodiments as collectors, in which case the spring device was embodied by a quartz piston filled with metal powder, a device that provided good thermal conductivity.

The nanopositioner allowed both manual and computerized (HP/LabView) relative position controls in various modes, such as manual positioning/manual readout; manual positioning/fast computerized data recording; and about 1 Å–30 Å per second computerized positioning/1 Hz data recording. Both voltage readout and a resistor bank connected in parallel to the converter were plugged into the data acquisition system.

A constant power setting with the heater, keeping the emitter at about 50° C., was used in some of the tests. The collector side was at about room temperature, stabilized by a massive metal chamber.

Thermal equilibration time was normally more than 24 hours, and measurements were taken with at least 6 hours of effective air conditioning in the room. Despite these operational precautions and the design incorporating Invar materials, inter-electrode gap drift could reach up to about 10 Å per minute or more if inter-electrode separation were left uncontrolled. This inter-electrode gap drift would develop even when the temperature sensors revealed no measurable temperature change. This inter-electrode gap drift was due to chamber wall expansion, and it could be avoided in some tests by inserting an internal frame.

Tests involved the touchdown of the electrodes and their subsequent controlled separation. For example, a Mo electrode brought into contact with a Au tip, and then separating them at about 0.5 Å steps. Due to the metal tip thermal expansion during touchdown, an expansion of about 10 Å per degree of tip temperature change would be experienced. Because of this expansion, electrodes are preferably touching for a short time. Otherwise the collector would "follow" the retreating emitter. This effect was compensated by suitable operation of the nanopositioner.

Numerous free standing electrode tests were performed. In some of these tests, a Mo emitter and a Au collector were used. One of the sets of free standing experiments was performed with a Mo emitter and a Au collector. Cleaning of the Au tip in this type of embodiment is advisable to prevent the tunneling signal reverse that would otherwise develop due to Au tip surface contamination. Cleaning is preferably performed by ultrasonic cleaning of the tip in deionized water. Tunneling signal reversal for tips cleaned in this fashion is avoided, and the current sign is then stable.

Estimates of conversion power density were performed in the context of this set of experiments by measuring maximum output at a given load and contact area. Manual positioning and fast recording was used. This operational mode enabled the recording of readings at spacings that were less than about 1 Å. The experiment included deforming the tip by 1000 Å and measuring deformed area by the atomic force microscope (AFM) by scanning the tip's end surface.

Figure 5:
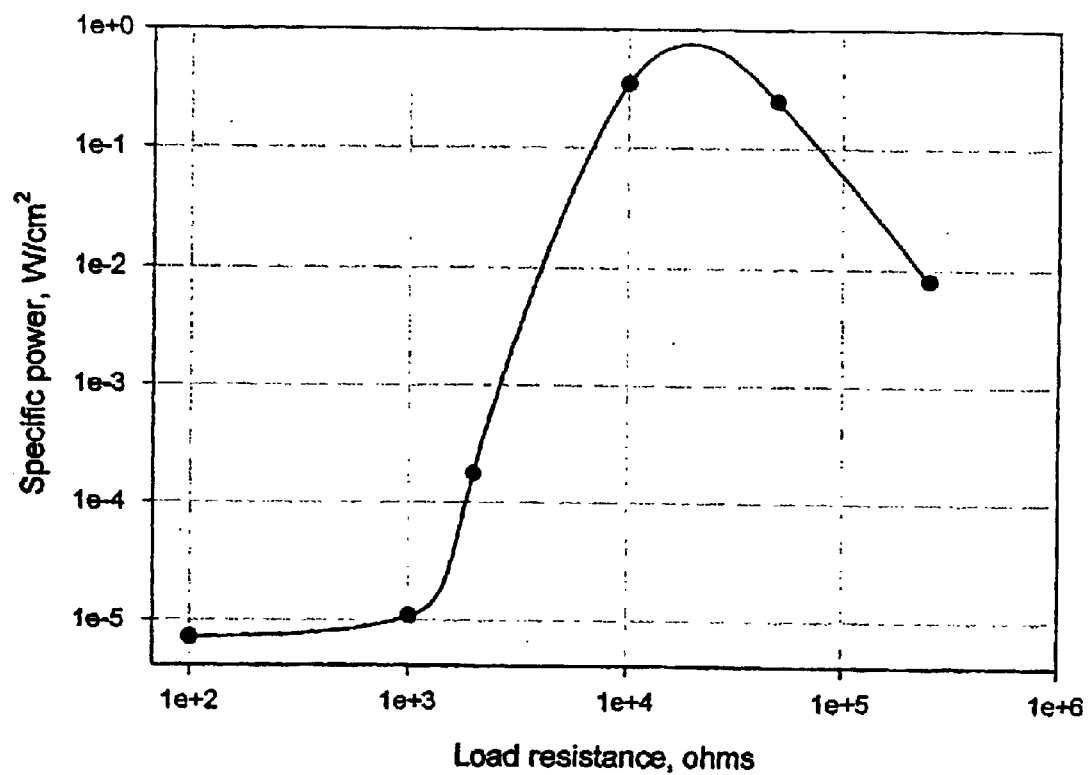
FIG. 5 displays a graph of specific power as a function of load resistance for some embodiments of the present invention.

A graph of specific power measured on a deformed and pulled away Au-tip is shown in FIG. 5. The surface of one of the tips had a protruding feature with a height of about 2000 Å. This feature was most likely smashed by about 1000 Å during deformation, and then reformed by elastic forces. AFM profiling led to a determination of an approximately (0.5 micron×0.5 micron) contact area. This area could have been significantly less during the gap opening. At 1 megaohm load, the highest voltage reading was 0.247 V, which corresponds to ~30 W/cm². When the load values approached 100 megaohm, the load was comparable to the voltmeter internal resistance and the signal to noise ratio decreased, although the maximum output went up. Maximum recorded values were roughly half of the contact potential difference, which in this case was 0.9 V.

Variations in the contact area can lead to voltage variations by a factor of ~100 for different tips at the same load, but the power density is likely to be the same at the same spacings and temperature difference. The calculated conversion power density was estimated at ~400 W/cm² at a 22° C. temperature difference for an idealized tunneling converter at the same temperature difference.

Tested materials in the context of this set of experiments experienced significant tunneling regime at spacings of less than about 3 Å. The spacing could be extended by a factor of about ten while this tunneling regime was maintained by lowering the emitter work function. Other experiments in addition to the free standing electrode experiments were also performed.

In another set of experiments, a device as shown schematically in the layout depicted in FIG. 4 was used. This device included a collector made of IBM optical disc Al substrate with a surface polishing of about 3 Å RMS. The spacers in this device were deposited on the collector by excimer laser ablation of a $TiO_2$ target. The resulting spacer particles had average particle size of about 25 Å–50 Å, and a small amount (~10/cm²) of large particles with ~500 Å diameter.

The emitter in this device was made of a silicon wafer (Virginia Semiconductor) whose thickness was about 10 micron and that was coated with a molybdenum layer that was about 1000 Å thick. Resulting surface roughness on this electrode was ~10 Å RMS.

A carbon nanowire mesh that was about 0.5 mm thick was placed on top of the emitter so that the emitter was subjected to an approximately uniform force load across its emitting surface. The nanowires in this mesh had a diameter of about 200 Å. A polished metal contact was placed in electrical communication with the nanowire mesh.

This device had an area of approximately (2 mm×2 mm) that was operating under tunneling regime. The experiments with this device were conducted with the same vacuum test apparatus as described above with the tip holding part removed. Pressure applied by the nanopositioner brought the emitter and collector at a relative separation such that the device was operating under tunneling regime. This pressure also served to reduce the size, and thus the spacing, of those spacer particles that could have been too big after their deposition.

When the applied temperature gradient was about 20 K, the observed voltage was approximately the same as that observed in the free-standing experiments, but the maximum current was measured as being about three orders of magnitude higher. This result showed a significant improvement in contact area, and this maximum current reading is envisaged as representing only a fraction of current readings that can be achieved with other embodiments according to this invention. This set of experiments further showed that embodiments of converters according to the present invention include not only working devices that have low electron work function coating, but also converters that do not comprise a coating with a low electron work function material. The design and manufacturing of embodiments that do not include such coating are simpler.

The following written description and graphic material refer to analytic and numerical models of phenomena that are associated with working embodiments of the present invention. These models are not provided as limiting explanations of the present invention. It is understood that the present invention is not limited or restricted to any single explanation of its underlying physical processes. The purpose of setting forth the analytic and numerical models discussed below is to highlight relevant variables that can be used to design additional embodiments envisaged within the scope of the present invention, even though such embodiments are not explicitly referred to in the context of this written description. With these design, the teachings of this written description, and ordinary skill in the art, additional embodiments that are within the scope of the present invention ad claims can be designed. Accordingly, the following written description and graphic material describe embodiments of the present invention and provide models that can be used for designing additional embodiments envisaged within the scope of the present invention.

The models described below include an approximation to the image force barrier reduction and electron tunneling probability in the WKB solution of the Schrodinger equation, derivation of current-voltage power and efficiency expressions in the presence of tunneling. Some of these expressions are further provided in alternative parametrized forms. The parametrizations used herein are not unique, and their choices are not limiting. The parametrization choices have been elected in a manner that is consistent with dimensionality and variable relevance criteria. The efficiency is separately analyzed in terms of radiative loss inclusion and radiative loss exclusion.

The expression that approximates the power flux for embodiments of this invention as given below shows a cubic power law increase with respect to temperature and it shows a power flux that is at least about one thousand times greater than that obtained with conventional converters. Some embodiments according to the present invention provide a power flux that exhibits at least a cubic power law relationship with respect to temperature. Some embodiments according to the present invention provide a power flux that is at least $10^3$ times greater than that provided by conventional converters. Still other embodiments according to the present invention provide a power flux that exhibits a cubic power law relationship with respect to temperature and that is at least $10^3$ times greater than that provided by conventional converters.

When the spacing between the emitter and the collector is relatively small (e.g., less than about 50 Å, see T. J. Coutts, Electrical conduction in thin metal films, Elsevier, N.Y., 1974), tunneling effects can be significant in electron transport.

In a one dimensional case, the WKB solution for electron tunneling probability D, i.e., for the ratio of transmission to reflection, of a Schrödinger equation $$-\frac{\hbar^2}{2 \cdot m}\nabla^2 \psi + \{V(x) - E(x)\}\psi = 0$$

is expressed by:

$$D = \exp\left\{-\frac{4\pi}{\hbar}\int_{x_1}^{x_2}[2m^2(V(x)-E)]^{\frac{1}{2}}dx\right\}$$

where E represents the electron energy, V(x) represents the electron potential energy, m is the electron mass, h is Plank's constant, and $x_1$ and $x_2$ represent the barrier beginning and end coordinates. A graph of D as a function of V in electron-volts and barrier in Å is shown in FIG. 3.

The tunneling effective barrier, Φ, can be significantly reduced by the image force effect in embodiments of this invention. The image force barrier reduction can bring the energy barrier down and make this kind of converter effectively operate at lower temperatures. Although not limited by any specific model, tunneling converters such as those within the scope of the present invention can be modelled by a near-thermionic approach as follows.

The effective barrier can be expressed as $\Phi=\Phi_0-\Delta\phi$, where $\Phi_0$ is the work function and $\Delta\phi$ is the image force barrier reduction that can be approximated at a charge q location x, as $$\Delta\Phi = \frac{q}{4\pi\varepsilon_0 S}\cdot\frac{1}{\left[1-4\frac{x^2}{S^2}\right]}$$

The term $\varepsilon_0$ in this equation represents the vacuum dielectric constant, and S the inter-electrode distance. Upon normalization with respect to the Fermi level, the resulting barrier has a parabolic shape and it strongly depends on S. The foregoing expression for $\Delta\phi$ permits to deduce that, when image force barrier reduction is taken into consideration, a transmission coefficient of about 0.5 is achievable when, for example, S is about 10 Å with a work function $\Phi_0$ of about 4.2 eV, and when S is about 25 Å with a work function $\Phi_0$ of about 1.5 eV.

Figure 6A:
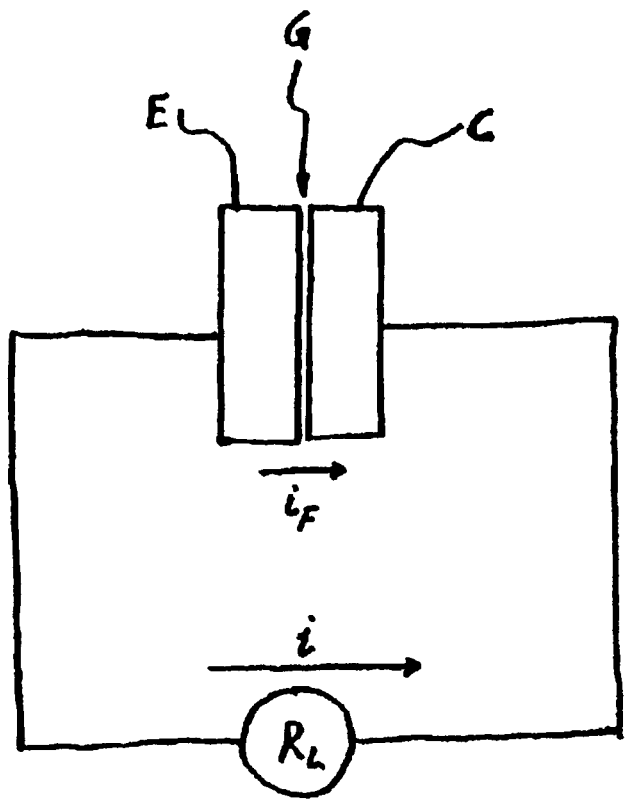
FIG. 6A schematically shows a set up for an embodiment of the present invention.
Figure 6B:
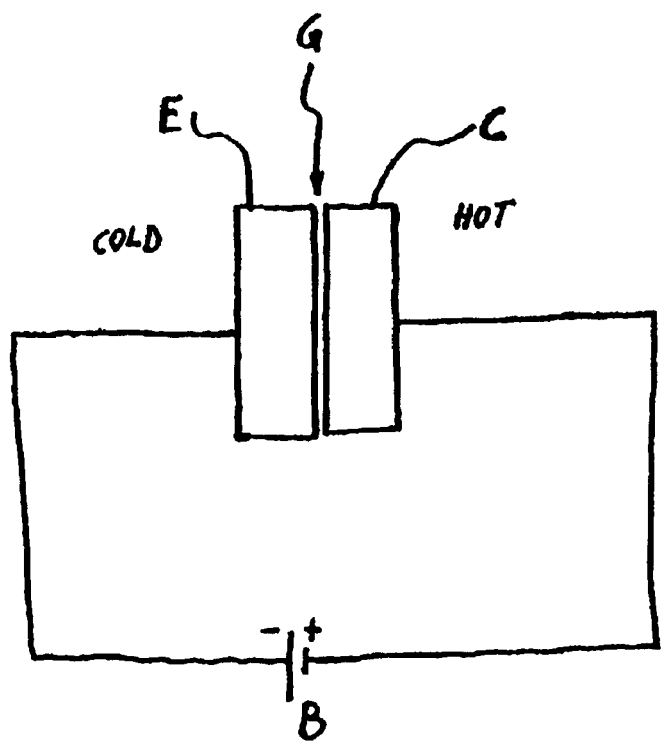
FIG. 6B schematically shows a set up another embodiment of the invention under cooling operational conditions.

Operational assemblies for embodiments of the present invention are schematically shown in FIGS. 6A–6B. The tunneling effect converter shown in FIG. 6A comprises a hot emitter E, and a cold collector C with a narrow gap G therebetween across which electrons tunnel. When the device operates to deliver electric current to an external load, an external circuit is closed by suitable electrical conductors to load $R_L$. The electric current intensity is conventionally designated by the arrow labelled as i; the voltage developed between the emitter and the collector is designated as V. The converter schematically shown in FIG. 6B performs as a cooler when electric power is supplied. The electric power supply is symbolized by battery B and the lower temperature and higher temperature sides of the converter are labeled, respectively, as "cold" and "hot".

The tunneling current form the emitter to the collector, including the vacuum voltage drop, is approximated by $$i_F = \frac{A_{\mathit{eff}} N_C(T_1) q\, v_{th}(T_1)}{4} e^{-qV/k_B T_1} e^{-\int_0^d \sqrt{2m[V(x)-E]/\hbar^2}\, dx}$$

where $A_{\mathit{eff}}$ is the effective tunneling area, which can be anticipated to be significantly less than the geometric surface area.

A more thorough treatment of this problem would include an integration over all of the electron states, with some explicit representation of the transmission coefficient at each electron energy. In addition, we one could average over all possible separation distances d. For the purposes of the present analysis, we will view the part of the electron distribution around the Fermi surface to act more or less like the thermionic problem. While the derivation of the thermionic current presumes that the states involved are several $k_B T$ above the Fermi surface, the tunneling current can involve states at or below the Fermi surface. This will imply corrections of order unity to the treatment given here for small V. The situation will be better in principle for carriers in a semiconductor. The first exponential term in the expression for $i_F$ above restricts tunneling to include states for which collector states are available.

An explicit representation for the tunneling factor is derived next. We assume a linear potential across the gap $$V(x) - E = \Phi + \frac{Vx}{d}$$

Electrons face the work function $\Phi$ at the emitter boundary. If the thermally-induced tunneling current drives a load, then the load voltage V will counter the current flow. For simplicity, we will assume that space charge effects can be ignored, and that the load voltage will induce a simple linear incremental voltage drop tot he cathode.

The tunneling integral can be done exactly in this case; we obtain $$\int_0^d \sqrt{2m[V(x)-E]/\hbar^2}\, dx = \frac{2}{3}\sqrt{\frac{2m}{\hbar^2}}\frac{d}{V}\left[(\Phi+V)^{\frac{3}{2}} - \Phi^{\frac{3}{2}}\right]$$

A more convenient form of this integral is derived below in terms of the essential dependence on the load voltage. Assuming that the load voltage is small compared to the work function leads to the approximation:

$$\int_0^d \sqrt{2m(V(x)-E)/\hbar^2}\, dx \approx \sqrt{\frac{2m\Phi}{\hbar^2}}\, d + \frac{1}{4}\sqrt{\frac{2m}{\hbar^2 \Phi}}\, Vd$$

The forward current is then $$i_F = \frac{A_{\mathit{eff}} N_C(T_1) q\, v_{th}(T_1)}{4} e^{-qV/k_B T_1} e^{-\sqrt{\frac{2m\Phi}{\hbar^2}}\, d} e^{-\frac{1}{4}\sqrt{\frac{2m}{\hbar^2 \Phi}}\, Vd}$$

At a similar level of approximation, the reverse current becomes $$i_R = -\frac{A_{\mathit{eff}} N_C(T_0) q\, v_{th}(T_0)}{4} e^{-\sqrt{\frac{2m\Phi}{\hbar^2}}\, d} e^{\frac{1}{4}\sqrt{\frac{2m}{\hbar^2 \Phi}}\, Vd}$$

We can include the temperature dependence of the prefactors explicitly to improve the model over the foregoing treatment. To do this, we express the prefactors in terms of the relevant Richardson coefficients $$\frac{N_C(T) q\, v_{th}(T)}{4} = A^* T^2$$

The total current is then $$i = i_F + i_R$$

$$= A_{\mathit{eff}} A * e^{-\sqrt{\frac{2m\Phi}{\hbar^2}}\, d}\left[T_1^2 e^{-qV/k_B T_1} e^{-\frac{1}{4}\sqrt{\frac{2m}{\hbar^2 \Phi}}\, Vd} - T_0^2 e^{\frac{1}{4}\sqrt{\frac{2m}{\hbar^2 \Phi}}\, Vd}\right]$$

This equation can be viewed as an iV characteristic which is a function of two temperatures. When coupled with the load, we have in addition $$V = i\, R_L$$

These two equations define the operating point current and voltage, both of which are functions of the two temperatures.

The power and efficiency are derived next. The power delivered to the load is $$P_L = iV = \frac{V^2}{R_L}$$

The heat flow associated with the tunneling current we will take to be on the order of $$P_T = i_F\left(V + \frac{3k_B T_1}{2q}\right) - i_R\left(V + \frac{3k_B T_0}{2q}\right)$$

The radiative loss is $$P_R = A\sigma(T_1^4 - T_0^4)$$

where $\sigma$ is the Stephan-Boltzmann constant. Note that the work function does not appear in association with the tunneling power. The efficiency of this system is $$\eta = \frac{P_L}{P_T + P_R}$$

It is convenient to parametrize the model in terms of fundamental parameters of the system, and this is done ass follows. To solve for the voltage, the current is eliminated to obtain $$V = R_L A_{eff} A * e^{-\sqrt{\frac{2m\Phi}{\hbar^2}}\,d} \left[ T_1^2 e^{-qV/k_B T_1} e^{-\frac{1}{4}\sqrt{\frac{2m}{\hbar^2 \Phi}}\,Vd} - T_0^2 e^{\frac{1}{4}\sqrt{\frac{2m}{\hbar^2 \Phi}}\,Vd} \right]$$

to be solved for the voltage. This equation allows for the identification of important parameters. The normalized vacuum gap distance in this problem can be taken to be $$\delta = \sqrt{\frac{2m\Phi}{\hbar^2}}\,d$$

It is convenient to take the normalized voltage and work function to be normalized against the same temperature; we define $$v = \frac{qV}{k_B T_1}$$

and $$\phi = \frac{q\Phi}{k_B T_1}$$

This allows us to recast the voltage constraint in terms of normalized variables $$v = \xi [e^{-v} e^{-v\delta/4\phi} - (1-\Delta\tau)^2 e^{v\delta/4\phi}]$$

where the normalized resistance $\xi$ is $$\xi = \frac{q}{k_B T_1} R_L A_{eff} A^* T_1^2 e^{-\sqrt{\frac{2m\Phi}{\hbar^2}}\,d}$$

The absolute temperature difference is again defined as $$\Delta_\tau = \frac{T_1 - T_0}{T_1}$$

We note that once the normalized resistance $\xi$ is defined, that the remaining normalized current-voltage relation depends on the gap thickness and potential barrier through a single parameter. It is convenient to define a new normalized distance parameter $$\Delta = \frac{\delta}{4\phi}$$

In terms of this normalized parameter, the normalized current-voltage constraint becomes $$v = \xi[e^{-v} e^{-v\Delta} - (1-\Delta\tau)^2 e^{v\Delta}]$$

As the normalized barrier $\phi$ is on the general order of 100, and since the normalized distance $\delta$ must be in the range of o(1–20), we see that relevant values of the new $\Delta$ parameter will be small. It would make sense to focus on values of $\Delta$ between 0 and 1 for the following analysis of the optimization of the efficiency, excluding radiative loss.

The efficiency $\eta$ of the system in the absence of radiative losses is defined as the ratio of the load power to the thermal power $$\eta = \frac{P_L}{P_T}$$

This expression can be expanded to yield.

$$\eta = \frac{(i_F + i_R)V}{(i_F + i_R)[V + 3k_B(T_0 + T_1)/4q] + (i_F - i_R)3k_B(T_1 - T_0)/4q}$$

In terms of normalized variables, this expression for the efficiency in the absence of radiative losses becomes $$\eta = \frac{v}{v + \frac{3}{4}(2 - \Delta\tau) + \frac{3}{4}\Delta\tau \frac{i_F - i_R}{i_F + i_R}}$$

Figure 7:
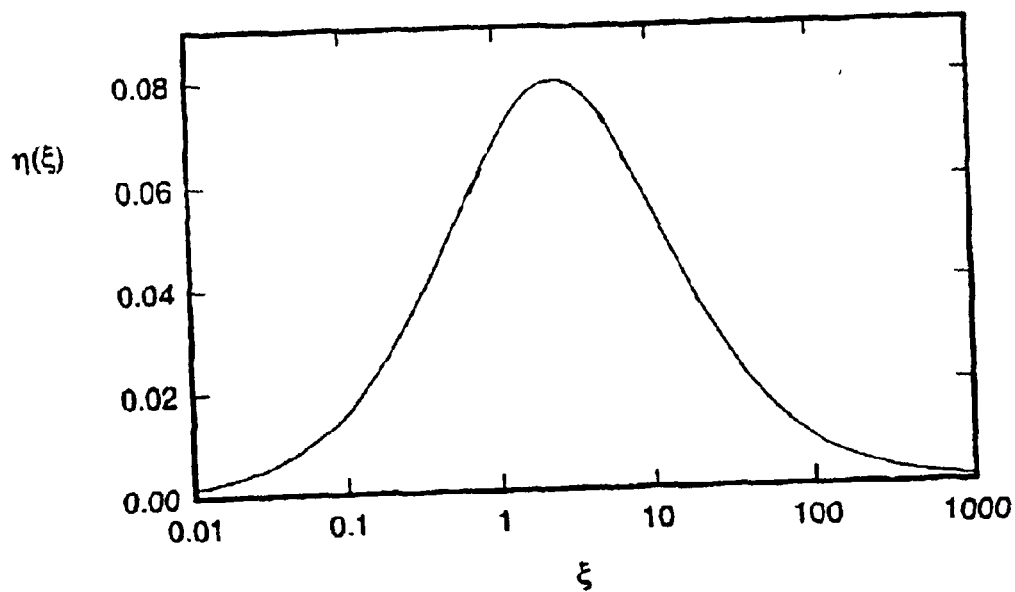
FIG. 7 shows the efficiency $\eta(\xi)$ as a function of the normalized resistance.

The efficiency $\eta$ can be viewed as being a function of the normalized load resistance $\xi$. If the load resistance is too small, then there is an impedance mismatch between the thermal source and the load, so that the load shorts out the voltage drop and little power is delivered. At high load impedance, the current is small so that little power is delivered to the load. The optimum occurs when the incremental source resistance is matched to the load. An example of this is illustrated in FIG. 7, that shows the efficiency $\eta(\xi)$ as a function of the normalized resistance. The normalized barrier height $\phi$ has been assumed to be 100 in this calculation, and the normalized distance $\delta$ to be 5, which corresponds to $\Delta = 0.0125$. The absolute temperature difference $\Delta\tau$ is 0.2. The efficiency is optimized when the load resistance is matched to the incremental resistance of the thermionic source.

Figure 8:
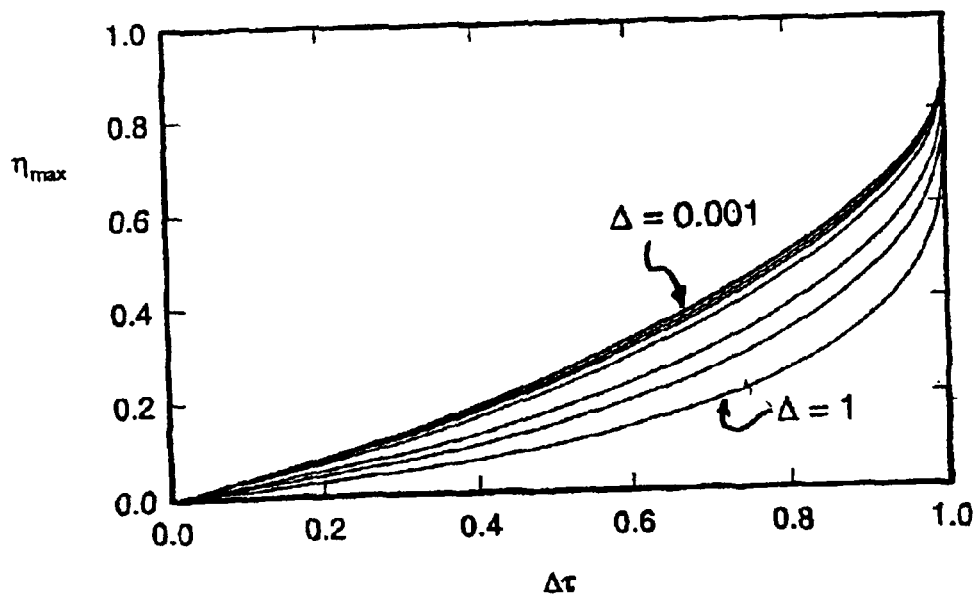
FIG. 8 shows results for the optimum efficiency as a function of $\Delta\tau$ for different values of $\Delta$.

Results for the optimum efficiency as a function of $\Delta\tau$ for different values of $\Delta$ are shown in FIG. 8. The maximum efficiency is limited by the thermodynamic constraint $$\eta_{max} < \Delta\tau$$

The maximum efficiency in this case is less than the thermodynamic limit, and is nearly independent of work function for the calculated terms shown in the same figure. Illustrated in FIG. 8 are results for $\Delta = 0.001$, 0.003, 0.005, 0.01, 0.03, 0.05, 0.1, 0.3, 0.5, 1. The value $\Delta = 0.001$ corresponds to a few Å, whereas the value $\Delta = 1$ corresponds to over 1000 Å.

Figure 9:
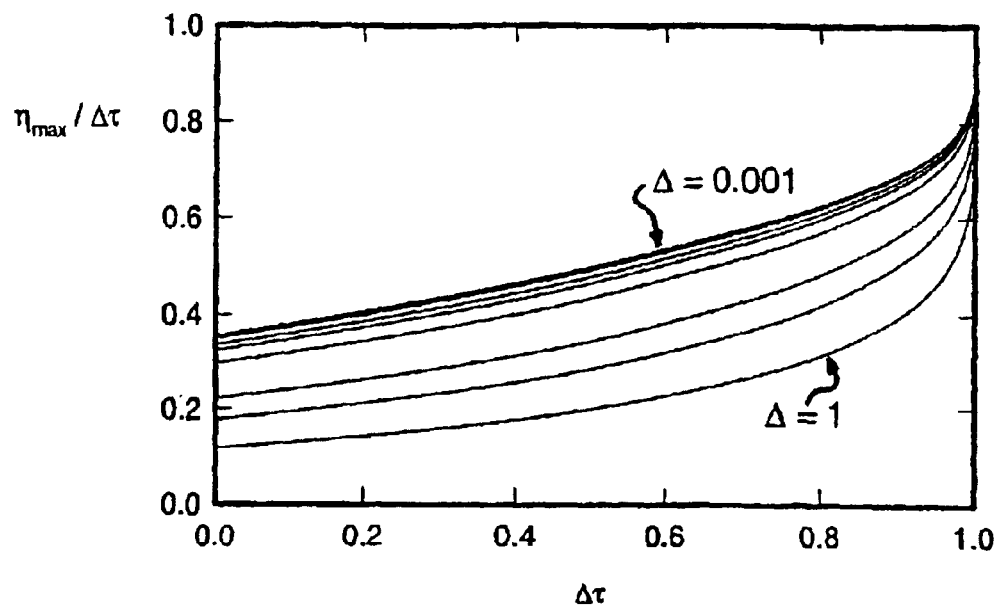
FIG. 9 illustrates the fraction $\eta_{max} < \Delta\tau$.

FIG. 9 illustrates the fraction $\eta_{max} < \Delta\tau$. One observes that this relative efficiency is again a weak function of the work function, and is lower than in the ideal free-streaming case.

The maximum normalized voltage that can be developed in this model is $$v_{max} = -\frac{2\ln(1 - \Delta\tau)}{1 + 2\Delta}$$

Figure 10:
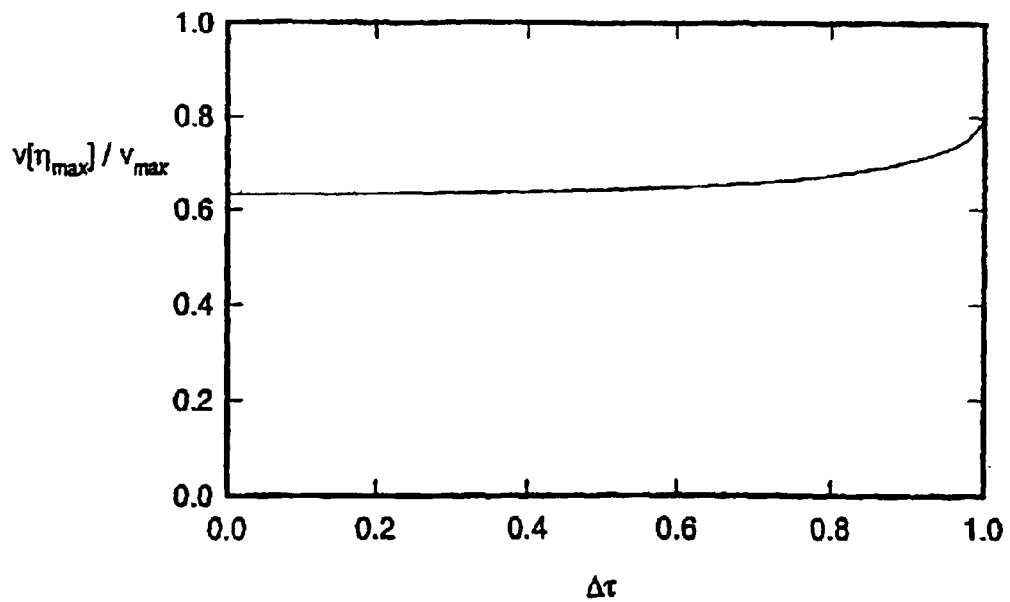
FIG. 10 shows the ratio $v/v_{max}$ at the point of optimum efficiency.

FIG. 10 shows the ratio $v/v_{max}$ at the point of optimum efficiency. In this case, we note that the optimum voltage becomes less compared to the maximum as the barrier increases. Illustrated in FIG. 10 are values for $\Delta = 0.001$, 0.003, 0.005, 0.01, 0.03, 0.05, 0.1, 0.3, 0.5, 1, all of which give the same results.

The load power is $$P_L = \frac{V^2}{R_L}$$

By defining the associated flux to be $$Q_L = \frac{P_L}{A} = \frac{V^2}{AR_L}$$

this is the power per unit area that can be delivered to the load, converted in units of watts per square centimeter. In terms of normalized units, this quantity is $$Q_L = \frac{A_{eff}}{A} A^* T_1^2 e^{-\sqrt{\frac{2m\Phi}{\hbar^2}} d} \frac{v^2}{\xi}$$

Figure 11:
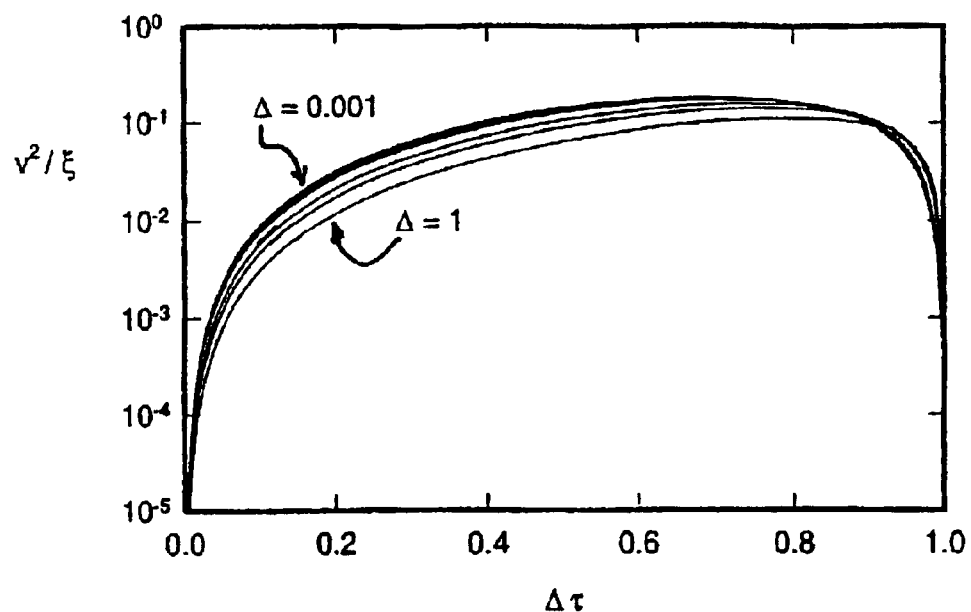
FIG. 11 shows normalized load power $v^2/\xi$ plotted as a function of the normalized temperature difference $\Delta\tau$ for different values of $\Delta=0.001, 0.003, 0.005, 0.01, 0.03, 0.05, 0.1, 0.3, 0.5, 1$.

The normalized load power $v^2/\xi$ is plotted in FIG. 11 as a function of the normalized temperature difference $\Delta\tau$ for different values of $\Delta$. The power is a moderately weak function of $\Delta$ over the range of interest, which includes $\Delta=0.001, 0.003, 0.005, 0.01, 0.03, 0.05, 0.1, 0.3, 0.5, 1$.

Commercial applications are conveniently done in terms of a power conversion that is measured in units of W/cm². To compare the normalized power against that of a real system, we need to have a numerical version of the prefactor. In this case, the thermionic emission from a metal into vacuum is characterized by $$A^* T^2 = 120 \, T_K^2 \, \frac{A}{cm^2}$$

where $T_K$ is the temperature in Kelvin. The relevant power flux of interest is determined by $$A^* T^2 \frac{k_B T_1}{q} = 2.80 \times 10^5 \left[\frac{T_1}{300K}\right]^3 \frac{Watts}{cm^2}$$

Figure 12:
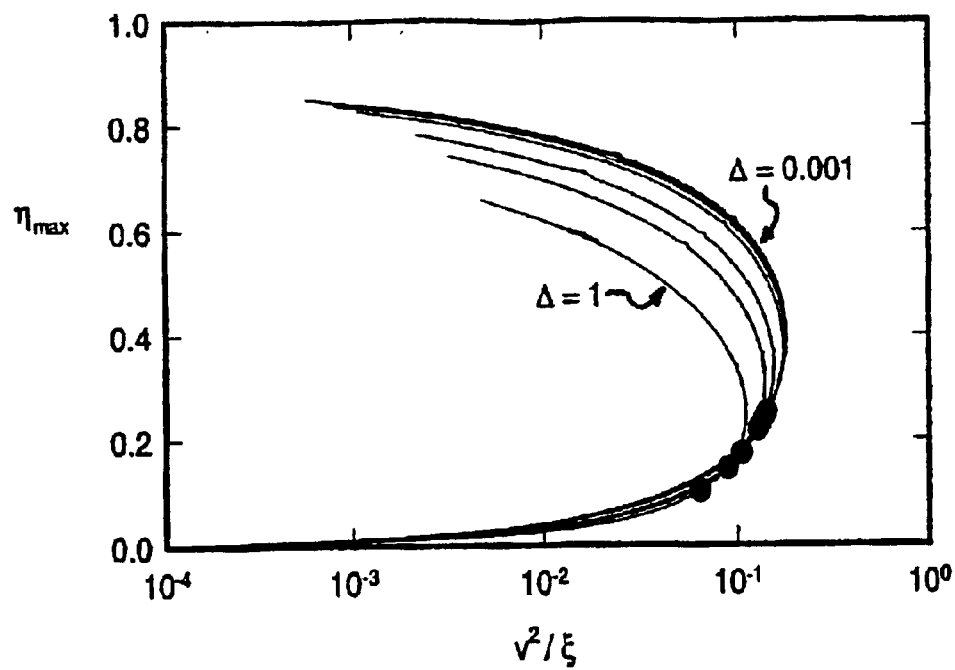
FIG. 12 shows efficiency as a function of power for optimized conversion systems at different normalized distance values $\Delta=0.001, 0.003, 0.005, 0.01, 0.03, 0.05, 0.1, 0.3, 0.5, 1$.
Figure 13:
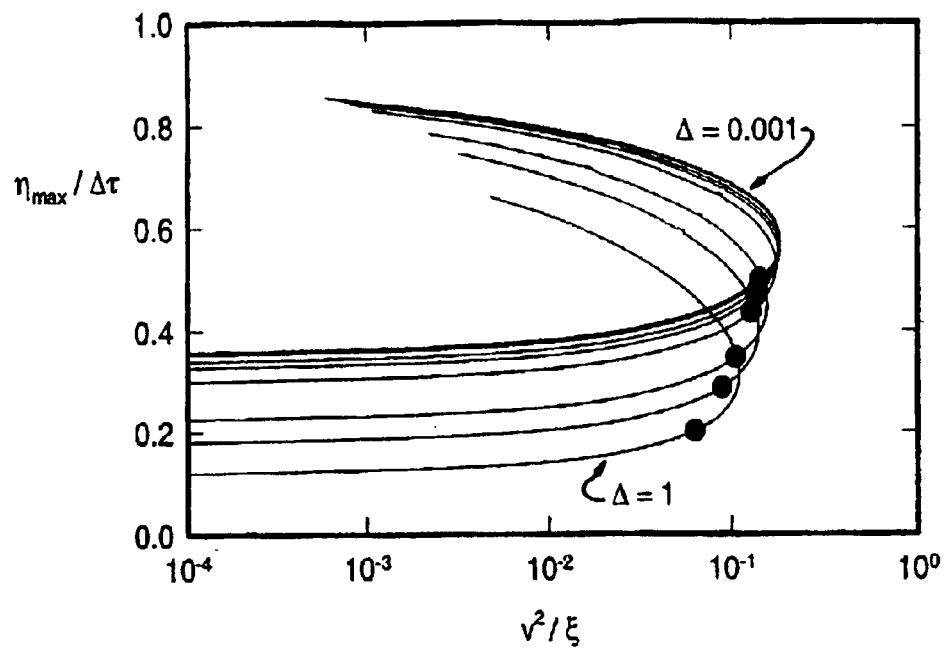
FIG. 13 shows normalized efficiency as a function of power for optimized conversion systems at different normalized distance values $\Delta=0.001, 0.003, 0.005, 0.01, 0.03, 0.05, 0.1, 0.3, 0.5, 1$.

The foregoing derivation shows the existence of a trade-off between power and efficiency which results in a requirement for compromise in commercial applications. For a tunneling thermionic converter, the efficiency versus normalized power and normalized efficiency versus power are shown in FIGS. 12–13. FIG. 12 shows efficiency as a function of power for optimized conversion systems at different normalized distance values $\Delta=0.001, 0.003, 0.005, 0.01, 0.03, 0.05, 0.1, 0.3, 0.5, 1$. The lines in the same figure include results for all possible $\Delta\tau$. The dots in the same figure indicate midpoint values where $\Delta\tau=\frac{1}{2}$. FIG. 13 shows normalized efficiency as a function of power for optimized conversion systems at different normalized distance values is schematically shown in As in FIG. 12, the lines include results for all possible $\Delta\tau$, and the dots indicate midpoint values where $\Delta\tau=\frac{1}{2}$.

No analogous trade-off is immediately apparent in this case. Instead, one would ideally seek a large $\Delta\tau$, on the order of about 0.5, so that the normalized power $v^2/\xi$ is on the order of about 0.1. In this case, the efficiency is in the vicinity of 0.2. The corresponding load power per unit area $Q_L$ is then on the order of $$Q_L \sim 0.1 \frac{A_{eff}}{A} A^* T^2 \frac{k_B T_1}{q} e^{-\sqrt{\frac{2m\Phi}{\hbar^2}} d} =$$

$$\frac{A_{eff}}{A} 2.8 \times 10^4 e^{-\sqrt{\frac{2m\Phi}{\hbar^2}} d} \left[\frac{T_1}{300K}\right]^3 \frac{Watts}{cm^2}$$

The load power per unit area is then determined by the tunneling factor, which is exponentially damped on the order of about a 1 Å scale length, and by the fractional area.

Thermal loss channels are included in a more realistic model. In the case of tunneling thermionic converter, radiative losses represent an obvious fundamental loss mechanism. It is of interest to examine briefly the degradation of the efficiency due to radiative losses. The efficiency in this case is $$\eta = \frac{P_L}{P_T + P_R}$$

In terms of normalized variables, this becomes $$\eta = \frac{\upsilon}{\upsilon + \frac{3}{4}(2-\Delta\tau) + \frac{3}{4}\Delta\tau \frac{i_F - i_R}{i_F + i_R} + \chi\left[\frac{1-(1-\Delta\tau)^4}{e^{-\upsilon}e^{-\upsilon\Delta} - (1-\Delta\tau)^2 e^{\upsilon\Delta}}\right]}$$

where $$\chi = \frac{A}{A_{eff}} \frac{q\sigma T_1}{k_B A^*} e^{\sqrt{\frac{2m\Phi}{\hbar^2}} d}$$

Numerically, this evaluates to $$\chi = 1.64 \times 10^{-7} \frac{A}{A_{eff}} \exp\left\{-0.512\left[\frac{d}{1 \, A}\right]\left[\frac{\Phi}{1 \, eV}\right]^{\frac{1}{2}}\right\}$$

Figure 14:
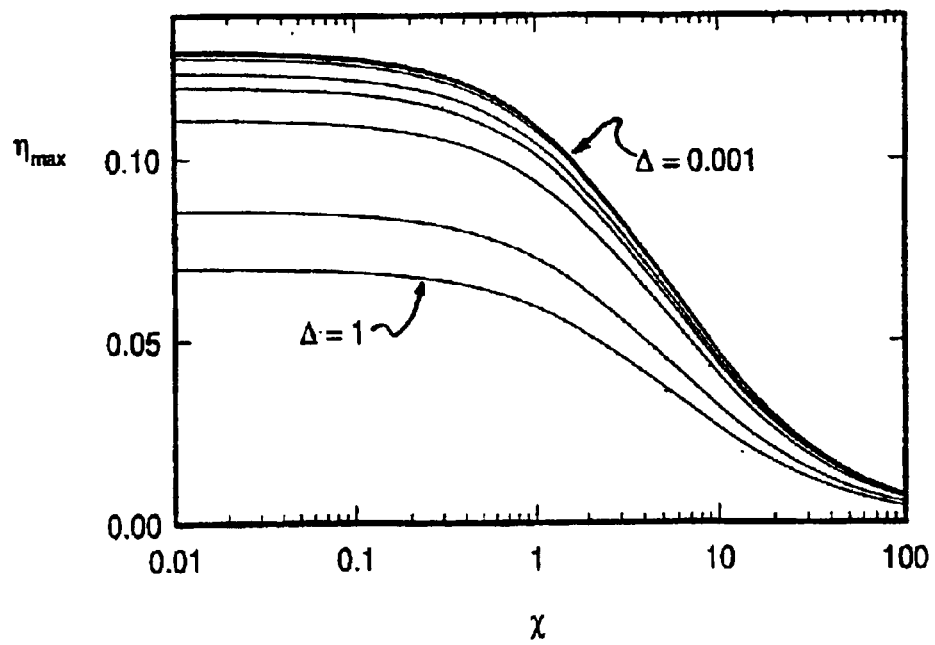
FIG. 14 the optimum efficiency plotted as a function of the normalized radiative loss parameter $\chi$ for $\Delta\tau=0.5$, and where the different curves correspond to normalized gap thickness values of $\Delta=0.001, 0.003, 0.005, 0.01, 0.03, 0.05, 0.1, 0.3, 0.5, 1$.

This equation shows that radiative losses degrade the efficiency of the system, as illustrated in FIG. 14, where the optimum efficiency is plotted as a function of the normalized radiative loss parameter $\chi$ for $\Delta\tau=0.5$, and where the different curves correspond to normalized gap thickness values of $\Delta=0.001, 0.003, 0.005, 0.01, 0.03, 0.05, 0.1, 0.3, 0.5, 1$.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A tunneling-effect converter, comprising:
   an electric charge collector having a collector surface, wherein said collector surface is atomically smooth;
   an electric charge emitter having an emitter surface, wherein said emitter surface is atomically smooth and wherein said emitter surface is separated from said collector surface by a gap such that said emitter surface is separated from said collector surface by a distance that is less than or equal to about 5 nm; and
   a spacer between said collector and said emitter, wherein said spacer comprises a dielectric material in contact with said collector surface and with said emitter surface;

wherein at least one of said collector and said emitter is a flexible electrode, the flexible electrode comprising a thin flexible layer, and said flexible layer comprises at least one of a a semiconductor material and the combination of a semiconductor material and a dielectric material, with an electrically conducting coating.

2. A tunneling effect converter as recited in claim 1, wherein said emitter surface is separated from said collector surface by a distance that is less than or equal to about 3 nm.

3. A tunneling-effect converter as recited in claim 1, wherein said gap comprises an inert gas.

4. A tunneling-effect converter as recited in claim 1, wherein said gap comprises a rarefied medium.

5. A tunneling-effect converter as recited in claim 1, wherein said flexible layer thickness is less than or equal to about 20 micrometers.

6. A tunneling-effect converter as recited in claim 1, wherein said electrically conducting coating is at least 20 nm thick.

7. A tunneling-effect converter as recited in claim 1, wherein said electrically conducting coating comprises a metal.

8. A tunneling-effect converter as recited in claim 1, wherein said flexible layer comprises silicon coated with nickel.

9. A tunneling-effect converter as recited in claim 1, wherein said flexible electrode comprises a mesh.

10. A tunneling effect converter as recited in claim 9, wherein said mesh comprises a nanowire mesh.

11. A tunneling-effect converter as recited in claim 10, wherein the wire diameter in said nanowire mesh is in the range from about 1 nm to about 50 nm.

12. A tunneling-effect converter as recited in claim 10, wherein said nanowire mesh comprises mesh material that is at least one of carbon, metal, metal-coated dielectric, semiconductor, and combinations thereof.

13. A tunneling-effect converter as recited in claim 1, wherein said emitter comprises silicon coated with an electric conductor.

14. A tunneling-effect converter as recited in claim 13, wherein said electric conductor comprises Mo.

15. A tunneling-effect converter as recited in claim 14, wherein said silicon is present in the form of a silicon layer that is less than or equal to about 10 micrometers and wherein said Mo is present as a coating whose thickness is less than or equal to about 1000 Å.

16. A tunneling-effect converter as recited in claim 1, wherein said emitter surface is coated with a low electron work function material.

17. A tunneling-effect converter as recited in claim 16, wherein said low electron work function material is at least one of an alkali metal, an alkaline earth metal, and combinations thereof.

18. A tunneling-effect converter as recited in claim 1, wherein said emitter surface comprises at least two coatings, a first coating comprising a material with an electron work function of at least about 3.5 eV, and wherein said first coating is coated with a second coating comprising a material with an electron work function that does not exceed about 3.5 eV.

19. A tunneling-effect converter as recited in claim 18, wherein said first coating comprises at least one of platinum oxide, silver oxide, tantalum oxide, vanadium oxide, Os, Ir, Pt, Re, Ni, W, and combinations thereof, and wherein said second coating comprises at least one of an alkali metal, an alkaline earth metal, and combinations thereof.

20. A tunneling-effect converter as recited in claim 1, wherein said collector comprises Al.

21. A tunneling-effect converter as recited in claim 1, wherein said collector comprises a metallized semiconductor.

22. A tunneling-effect converter as recited in claim 1, wherein said collector surface and said emitter surface are finished to a surface roughness that does not exceed about 20 Å RMS.

23. A tunneling-effect converter as recited in claim 1, wherein said collector surface and said emitter surface are finished to a surface roughness that does not exceed about 10 Å RMS.

24. A tunneling-effect converter as recited in claim 1, wherein said collector surface comprises the surface of a high IR reflectivity material.

25. A tunneling-effect converter as recited in claim 24, wherein said high reflectivity material comprises at least one of Al, Cu, Ag, Au, and combinations thereof.

26. A tunneling-effect converter as recited in claim 1, wherein said emitter surface comprises the surface of a high IR emissivity material.

27. A tunneling-effect converter as recited in claim 26, wherein said high IR emissivity material comprises at least one of metal carbide, Fe, Ni, Co, and combinations thereof.

28. A tunneling-effect converter as recited in claim 9, wherein the wire diameter in said mesh is less than or equal to about 0.5 mm.

29. A tunneling-effect converter as recited in claim 16, wherein said low electron work function material is at least one of Cs, Ba, Sr, Rb, Na, Ca, Li, and combinations thereof.

30. A tunneling-effect converter as recited in claim 19, wherein said first coating comprises at least one of platinum oxide, silver oxide, tantalum oxide, vanadium oxide, Os, Ir, Pt, Re, Ni, W, and combinations thereof, and wherein said second coating comprises at least one of Cs, Ba, Sr, Rb, Na, Ca, Li, and combinations thereof.

31. A tunneling-effect converter, comprising:
an electric charge collector having a collector surface;
an electric charge emitter having an emitter surface, wherein said collector surface is separated from said emitter surface by a distance such that the probability for electron tunneling between said emitter surface and said collector surface is at least 0.1%; and
a spacer between said collector and said emitter, wherein said spacer comprises a dielectric material in contact with said collector surface and with said emitter surface;
wherein said collector surface and said emitter surface are finished to a surface roughness that does not exceed about 20 Å RMS.

32. A tunneling-effect converter as recited in claim 31, wherein said emitter surface is separated form said collector surface by a distance that is less than or equal to about 5 nm.

33. A tunneling-effect converter as recited in claim 31, wherein at least one of said emitter and said collector is a flexible electrode.

34. A tunneling-effect converter as recited in claim 31, wherein said collector surface comprises the surface of a high IR reflectivity material.

35. A tunneling-effect converter as recited in claim 31, wherein said emitter surface comprises the surface of a high IR emissivity material.

36. A tunneling-effect converter as recited in claim 33, wherein said flexible electrode comprises a mesh.

37. A tunneling-effect converter as recited in claim 31, wherein said emitter surface is coated with a low electron work function material.

38. A tunneling-effect converter, comprising:
an electric charge collector having a collector surface;
an electric charge emitter having an emitter surface, wherein at least one of said collector and said emitter comprises an electrically conductive flexible layer, wherein said flexible layer is in electrical communication with an electrically conductive mesh; and
a spacer between said collector and said emitter, wherein said spacer comprises a dielectric material in contact with said collector surface and said emitter surface, and wherein said emitter surface is separated from said collector surface by a distance that is less than or equal to about 5 nm.

39. A tunneling-effect converter as recited in claim 38, wherein said collector surface and said emitter surface are atomically smooth.

40. A tunneling-effect converter as recited in claim 39, wherein said collector surface and said emitter surface are finished to a surface roughness that does not exceed about 20 Å RMS, and wherein said flexible layer has a thickness that does not exceed about 20 micrometers.

41. A tunneling-effect converter, comprising:
an electric charge collector having a collector surface that is atomically smooth;
an electric charge emitter having an emitter surface that is atomically smooth,
wherein at least one of said collector and said emitter is a flexible electrode;
a spacer between said collector and said emitter, wherein said spacer comprises dielectric material in contact with said collector surface and said emitter surface; and
means for load distribution applied to said flexible electrode;
wherein at least one of said collector and said emitter is a flexible electrode, the flexible electrode comprising a thin flexible layer, and said flexible layer comprises at least one of a a semiconductor material and the combination of a semiconductor material and a dielectric material, with an electrically conducting coating.

42. A tunneling-effect converter as recited in claim 41, wherein said emitter surface is separated from said collector surface by a distance that is less than or equal to about 5 nm.

43. A tunneling-effect converter as recited in claim 41, wherein said means for load distribution comprises an external applicator of a compressive force.

44. A tunneling-effect converter as recited in claim 41, wherein said means for load distribution comprises a holder.

45. A tunneling-effect converter as recited in claim 41, wherein said means for load distribution comprises an adhesive material.

46. A tunneling-effect converter as recited in claim 41, wherein said means for load distribution comprises at least one clamp.

47. A tunneling-effect converter as recited in claim 41, wherein said means for load distribution comprises an interlocking device.

48. A tunneling-effect converter as recited in claim 41, wherein said means for load distribution comprises a sealant.

49. A tunneling-effect converter as recited in claim 41, wherein said means for load distribution comprises an encapsulant.

50. A tunneling-effect converter as recited in claim 41, wherein said means for load distribution comprises a mesh.

51. A tunneling-effect converter as recited in claim 41, wherein said means for load distribution comprises a flexible mesh.

52. A tunneling-effect converter, comprising:
an electric charge collector having a collector surface that is atomically smooth;
an electric charge emitter having an emitter surface that is atomically smooth, wherein said emitter surface is separated from said collector surface by a gap; and
a spacer between said collector and said emitter, wherein said spacer comprises a dielectric material in contact with said collector surface and with said emitter surface;
wherein at least one of said emitter and said collector is a flexible electrode that comprises a mesh.

53. A tunneling-effect converter as recited in claim 52, wherein a wire diameter in said mesh is less than or equal to about 0.5 mm.

54. A tunneling-effect converter as recited in claim 52, wherein said mesh comprises a nanowire mesh.

55. A tunneling-effect converter as recited in claim 54, wherein a wire diameter in said nanowire mesh is in the range from about 1 nm to about 50 nm.

56. A tunneling-effect converter as recited in claim 54, wherein said nanowire mesh comprises mesh material that is at least one of carbon, metal, metal-coated dielectric, semiconductor, and combinations thereof.

57. A tunneling-effect converter, comprising:
an electric charge collector having a collector surface that is atomically smooth;
an electric charge emitter having an emitter surface that is atomically smooth and separated from said collector surface by a gap, wherein said emitter surface comprises at least two coatings including a first coating comprising a material with an electron work function of at least about 3.5 eV, and a second coating comprising a material with an electron work function that does not exceed about 3.5 eV; and
a spacer between said collector and said emitter, wherein said spacer comprises a dielectric material in contact with said collector surface and with said emitter surface.

58. A tunneling-effect converter as recited in claim 57, wherein said first coating comprises at least one of platinum oxide, silver oxide, tantalum oxide, vanadium oxide, Os, Ir, Pt, Re, Ni, W, and combinations thereof, and wherein said second coating comprises at least one of an alkali metal, an alkaline earth metal, and combinations thereof.

59. A tunneling-effect converter, comprising:
an electric charge collector having a collector surface;
an electric charge emitter having an emitter surface, wherein said emitter surface is separated from said collector surface by a gap; and
a spacer between said collector and said emitter, wherein said spacer comprises a dielectric material in contact with said collector surface and with said emitter surface;
wherein said collector surface and said emitter surface are finished to a surface roughness that does not exceed about 20 Å RMS.

* * * * *

UNITED STATES PATENT AND TRADEMARK OFFICE
CERTIFICATE OF CORRECTION

PATENT NO. : 6,946,596 B2
APPLICATION NO. : 10/243455
DATED : September 20, 2005
INVENTOR(S) : Yan R. Kucherov and Peter L. Hagelstein It is certified that error appears in the above-identified patent and that said Letters Patent is hereby corrected as shown below:

Cover page
Item [56], References Cited, OTHER PUBLICATIONS, page 2, entry "DiSalvo, Francis" change "703–70" to --703–706--

Column 1
Line 19, change "devices" to --device--

Column 3
Line 29, change "temperatures such" to --such temperatures--

Column 4
Line 19, change "set up another" to --set up for another--

Column 8
Line 1, change "tens of" to --tenths of a--

Column 12
Line 58, change "FIG. 3" to --FIG. 4--

Column 15
Line 41, change "these" to --this--
Line 44, change "ad" to --and--
Line 51, change "Schrodinger" to --Schrödinger--

Column 16
Line 29, change "h" to --ℏ--

Column 17
Line 49, change "to the" to --to the--

Column 18
Line 65, change "ass" to --as--

Column 19
Line 61, change "o(1-20)" to --O(1-20)--

UNITED STATES PATENT AND TRADEMARK OFFICE
CERTIFICATE OF CORRECTION

PATENT NO. : 6,946,596 B2
APPLICATION NO. : 10/243455
DATED : September 20, 2005
INVENTOR(S) : Yan R. Kucherov and Peter L Hagelstein It is certified that error appears in the above-identified patent and that said Letters Patent is hereby corrected as shown below:

Column 21
Lines 57 and 58, change "values is schematically shown in As" to --values. As--

Column 25
Line 37, change "a a semiconductor" to --a semiconductor--

Signed and Sealed this

Twenty-sixth Day of September, 2006

JON W. DUDAS
*Director of the United States Patent and Trademark Office*